United States Patent
Lee

(10) Patent No.: US 7,482,848 B2
(45) Date of Patent: Jan. 27, 2009

(54) INTERNAL CLOCK GENERATION CIRCUITS WITH IMPROVED LOCKING SPEED AND CORRESPONDING METHODS

(75) Inventor: Jae-Young Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 11/177,846

(22) Filed: Jul. 8, 2005

(65) Prior Publication Data

US 2006/0109044 A1 May 25, 2006

(30) Foreign Application Priority Data

Nov. 23, 2004 (KR) ...................... 10-2004-0096059

(51) Int. Cl.
*H03D 3/24* (2006.01)
*H03L 7/06* (2006.01)

(52) U.S. Cl. ................... 327/158; 327/152; 327/149

(58) Field of Classification Search ......... 327/147–149, 327/156–158; 375/375, 376
See application file for complete search history.

(56) References Cited

U.S. PATENT DOCUMENTS

| | | | | |
|---|---|---|---|---|
| 6,323,705 B1 | 11/2001 | Shieh et al. | .................. | 327/158 |
| 6,333,658 B1 | 12/2001 | Akita et al. | .................. | 327/280 |
| 6,333,959 B1 | 12/2001 | Lai et al. | ................... | 377/69 |
| 6,373,303 B2 | 4/2002 | Akita | ......................... | 327/156 |
| 6,373,913 B1 * | 4/2002 | Lee | ............... | 375/376 |
| 6,437,613 B2 | 8/2002 | Shim et al. | ................. | 327/108 |
| 6,449,212 B1 | 9/2002 | Toda et al. | ................. | 365/233 |
| 6,628,154 B2 * | 9/2003 | Fiscus | ........................ | 327/158 |
| 6,801,067 B2 | 10/2004 | Jang | ............................. | 327/161 |
| 7,084,682 B2 * | 8/2006 | Jeon et al. | .................... | 327/158 |
| 2003/0227309 A1 | 12/2003 | Jang | | |

FOREIGN PATENT DOCUMENTS

KR 10-2003-0095081 12/2003

OTHER PUBLICATIONS

English Translation of Office Action for Korean Patent Application No. 10-2004-0096059 mailed on Apr. 28, 2006 (previously submitted in IDS filed Jun. 19, 2006).
Office Action for Korean Patent Application No. 10-2004-0096059 mailed on Apr. 28, 2006.
Office Action for German Application No. 10-2005-038 519.2 mailed on Oct. 30, 2007.

* cited by examiner

*Primary Examiner*—Dinh T. Le
(74) *Attorney, Agent, or Firm*—Myers Bigel Sibley & Sajovec

(57) ABSTRACT

Internal clock generation circuits are provided that include a first delay circuit that is responsive to a first clock signal, a coarse locking circuit that includes at least one analog synchronous mirror delay circuit, the coarse locking circuit responsive to an output from the first delay circuit and to the first clock signal, a voltage controlled delay circuit that is responsive to an output of the coarse locking circuit and to a voltage control signal, a second delay circuit that is responsive to an output of the voltage controlled delay circuit and a fine locking block that is responsive to an output of the second delay circuit and the first clock signal that is configured to generate the voltage control signal. Additionally, improved ASMD circuits are also disclosed, as are methods of generating an internal clock signal.

27 Claims, 17 Drawing Sheets

IN CASE OF FIRST ASMD

IN CASE OF SECOND ASMD

IN CASE OF THIRD ASMD

IN CASE OF FOURTH ASMD

WHEN ECLK IS HIGH FREQUENCY SIGNAL

WHEN ECLK IS LOW FREQUENCY SIGNAL

US 7,482,848 B2

INTERNAL CLOCK GENERATION CIRCUITS WITH IMPROVED LOCKING SPEED AND CORRESPONDING METHODS

CLAIM OF PRIORITY

This application claims priority under 35 U.S.C. §119 from Korean Patent Application No. 10-2004-0096059, filed on Nov. 23, 2004, the disclosure of which is hereby incorporated by reference herein as if set forth in its entirety.

FIELD OF THE INVENTION

The present invention relates, in general, to electronic circuits and, more particularly, to internal clock generation circuits for generating internal clock signals and corresponding methods of generating such internal clock signals.

BACKGROUND OF THE INVENTION

Synchronous Dynamic Random Access Memory (SDRAM) devices typically include an internal clock generation circuit that generates an internal clock signal that is locked to an external reference clock signal. The generated internal clock signal may be used in the generation of internal signals that are used to operate the SDRAM device and to control data input and output operations.

FIG. 1 is a block diagram of a conventional internal clock generation circuit 100 that may be used, for example, in an SDRAM device. The conventional internal clock generation circuit 100 includes a fine locking block 160, a Voltage Controlled Delay (VCD) block 130 and a Delay Mirror Circuit (DMC) 150. The fine locking block 160 includes a Phase Detector (PD) 161, a Charge Pump (CP) 163, and a Loop Filter (LF) 165, which are used to generate a voltage control signal VCONT. The voltage control signal VCONT controls the delay time of the VCD 130 so that the phase of a detection clock signal TCLK matches the phase of a buffered clock signal BCLK. As a result, the phase of an internal clock signal ICLK ultimately matches the phase of an external clock signal ECLK. However, a locking time of several hundred to several thousand cycles may be required to lock the phase of the internal clock signal ICLK to the phase of the external clock signal ECLK using the conventional internal clock generation circuit 100 of FIG. 1.

Analog Synchronous Mirror Delay (ASMD) circuits may also be used to generate an internal clock signal that is synchronized with an external reference clock signal. With such ASMD circuits, an output clock signal may be locked to a received clock signal with a locking time of as little as two clock cycles. However, conventional ASMD circuits may have a narrow operating range. Thus, they may not be able to cope with frequency variation in a received clock signal.

SUMMARY OF THE INVENTION

Pursuant to embodiments of the present invention, clock generation circuits are provided which include a coarse locking circuit and a fine locking circuit. These clock generation circuits further include a first delay circuit that is responsive to a first clock signal which, for example, may be an external clock signal or a buffered (delayed) version of the external clock signal. The coarse locking circuit includes at least one analog synchronous mirror delay circuit, and is responsive to an output from the first delay circuit and to the first clock signal. A voltage controlled delay circuit is also provided that is responsive to an output of the coarse locking circuit and to a voltage control signal. The output of the voltage controlled delay circuit is provided to a second delay circuit. The fine locking circuit is responsive to an output of the second delay circuit and the first clock signal, and is configured to generate the voltage control signal.

The clock generation circuit may also include a third delay circuit that is responsive to the output of the voltage controlled delay circuit. Additionally, a fourth delay circuit may be provided that is configured to generate the first clock signal from an external clock signal. In a specific embodiment of the present invention, the first delay circuit may be used to delay the first clock signal by a delay time that is equal to the sum of a first transmission delay time, a second transmission delay time and a third transmission delay time, the voltage controlled delay circuit may be used to delay the output of the coarse locking circuit by the second transmission delay time, the second delay circuit may be used to delay the output of the voltage controlled delay circuit by a delay time that is equal to the sum of the first transmission delay time and the third transmission delay time, the third delay circuit may be used to delay the output of the voltage controlled delay circuit by the third transmission delay time, and the fourth delay circuit may be used to delay the external clock signal by the first transmission delay time.

In certain embodiments of the present invention, the coarse locking circuit may include at least one logic circuit that is responsive to the output of the first delay circuit and to the first clock signal. A plurality of analog synchronous mirror delay circuits are also included that are responsive to the one (or more) logic circuits. Finally, an edge detector is provided that is responsive to respective outputs of the plurality of analog synchronous mirror delay circuits. The analog synchronous mirror delay circuits may, for example, be configured as discussed below.

In certain embodiments of the present invention, the clock generation circuit may also include a discharge control signal generation circuit that is configured to control a logic state of a discharge control signal based on the frequency of a clock cycle of an external clock cycle. In certain embodiments of the present invention, this discharge control signal generation circuit may be implemented as a reference frequency generation circuit that is responsive to a rising edge of clock cycle of the external clock signal, a start clock acquisition circuit that is configured to acquire the clock cycle of the external clock signal and an active range comparison circuit that is configured to generate the discharge control signal in response to the output of the reference frequency generation circuit and the start clock acquisition circuit.

Pursuant to further embodiments of the present invention, analog synchronous mirror delay (ASMD) circuits are provided. These circuits include first and second precharge circuits that are responsive to respective first and second precharge signals, as well as first and second discharge circuits that are coupled to the respective outputs of the first and second precharge circuits and that are responsive to a discharge control signal and respective first and second reference input signals. First and second charge circuits are also included that are coupled to the outputs of the first and second precharge circuits, respectively. Finally, the ASMD circuit includes a comparison circuit that is coupled to the outputs of the first precharge circuit and the second precharge circuit. In these ASMD circuits, the first discharge circuit may be include a first discharge control circuit that is responsive to the first reference input signal and a first current source that is responsive to the discharge control signal that is configured to control the amount of current flowing through the first discharge control circuit.

Pursuant to still further embodiments of the present invention, methods of generating an internal clock signal that is synchronized with an external clock signal are provided. Pursuant to these methods, first and second clock signals are provided to a coarse locking circuit that includes a plurality of analog synchronous mirror delay circuits. At least one of the first or second clock signals is derived from the external clock signal. The plurality of analog synchronous mirror delay circuits are used to generate a third clock signal. This third clock signal is then delayed by a delay time that is determined based on the value of a control signal to lock the first clock signal to the second clock signal. The delayed third clock signal is provided to a fine locking circuit, which is used to generate the control signal. Finally, the internal clock signal is generated from one of the first, second or third control signals. In these methods, the locking of the first clock signal to the second clock signal locks the internal clock signal to the external clock signal.

In certain embodiments of these methods, the internal clock signal may be generated by further delaying the delayed third clock signal to provide the internal clock signal. Likewise, the first clock signal may be provided by buffering the external clock signal by a first transmission delay time. The second clock signal may be generated by delaying the first clock signal by a first mirroring delay time. Additionally, the method may further include delaying the delayed third clock signal by a second mirroring delay time before providing the delayed third clock signal to the fine locking circuit.

In other embodiments, the internal clock signal may be generated by delaying the delayed third clock signal by a third transmission delay time. The first mirroring delay time may be is equal to the sum of the first transmission delay time, the delay time and the third transmission delay time, and the second mirroring delay time may be equal to the sum of the first transmission delay time and the third transmission delay time.

Pursuant to still further embodiments of the present invention, methods of generating an internal clock signal that is synchronized with an external clock signal are provided in which a first clock signal is delayed by a first delay time to generate a second clock signal. The first clock signal and the second clock signal are then provided to a coarse locking block that includes at least one analog synchronous mirror delay circuit to generate a third clock signal. The third clock signal is delayed by a second transmission delay time to generate a fourth clock signal. The fourth clock signal is delayed by a third transmission delay time to generate the internal clock signal. A copy of the fourth clock signal is delayed by a second delay time to generate a fifth clock signal, where the second delay time may be equal to the sum of a first transmission delay time and a third transmission delay time. A control signal is generated based on a comparison of a phase of the fifth clock signal and a phase of the first clock signal. Finally, the control signal is used to control the second delay time to lock the fifth clock signal to the first clock signal, wherein the locking of the fifth clock signal to the first clock signal locks the internal clock signal to the external clock signal.

These methods may further include generating the first clock signal from the external clock signal by offsetting the external clock signal by the first transmission delay time. The first delay time may be equal to the sum of the first transmission delay time, the second transmission delay time and the third transmission delay time.

The analog synchronous mirror delay circuit may be used to provide an analog output clock signal that is used to generate an edge of the third clock signal. In certain embodiments of the present invention, this may be accomplished by precharging first and second comparison signals to a predetermined precharge level, and then discharging the first comparison signal with a reference discharge capability during a first interval to a predetermined discharge voltage level, and discharging the second comparison signal with the reference discharge capability during a second interval to the predetermined discharge voltage level. An analog output clock signal having a first logic state is also provided. The logic state of this signal is then changed in response to the voltage of second comparison signal reaching the predetermined discharge voltage level. Moreover, in certain embodiments the reference discharge capability may be based on the frequency variation of the external clock signal. This may be accomplished, for example, generating a discharge control signal that has a logic state that is based on a frequency of a clock cycle of the external clock signal and then using the discharge control signal to control the reference discharge capability.

Pursuant to yet further embodiments of the present invention, there is provided an internal clock generation circuit for generating an internal clock signal synchronized with a predetermined external clock signal. This internal clock generation circuit includes a first delay mirror circuit, a coarse locking block, a voltage controlled delay block, a second delay mirror circuit and a fine locking block. The first delay mirror circuit delays a predetermined buffered clock signal by a first mirroring time and provides the delayed buffered clock signal as a delayed clock signal. The first mirroring delay time is equal to the sum of first to third transmission delay times. Further, the buffered clock signal is offset from the external clock signal by a first transmission delay time. The coarse locking block provides an analog synchronous clock signal using the buffered clock signal and the delayed clock signal. The coarse locking block includes at least one analog synchronous mirror delay driven to lock a detection clock signal to the buffered clock signal. The analog synchronous mirror delay provides an analog output clock signal used to generate an edge of the analog synchronous clock signal in response to the same discharge voltage level time point. The same discharge voltage level time point is a point when first and second comparison signals, precharged to a predetermined precharge level, are discharged with the same reference discharge capability in different intervals and then have the same voltage level. The precharge and discharge of the first and second comparison signals are controlled in response to signals generated by logical combinations of the buffered clock signal and the delayed clock signal. The voltage controlled delay block delays the analog output clock signal by the second transmission delay time and provides the delayed analog output clock signal as a preliminary clock signal. The internal clock signal is offset from the preliminary clock signal by the third transmission delay time. The second transmission delay time is controlled in response to a predetermined voltage control signal. The second delay mirror circuit delays the preliminary clock signal by a second mirroring delay time and provides the delayed preliminary clock signal as the detection clock signal. The second mirroring delay time is equal to the sum of the first and second transmission delay times. The fine locking block compares phases of the detection clock signal and the buffered clock signal with each other, and generates the voltage control signal. The voltage control signal is controlled to lock the detection clock signal to the buffered clock signal.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
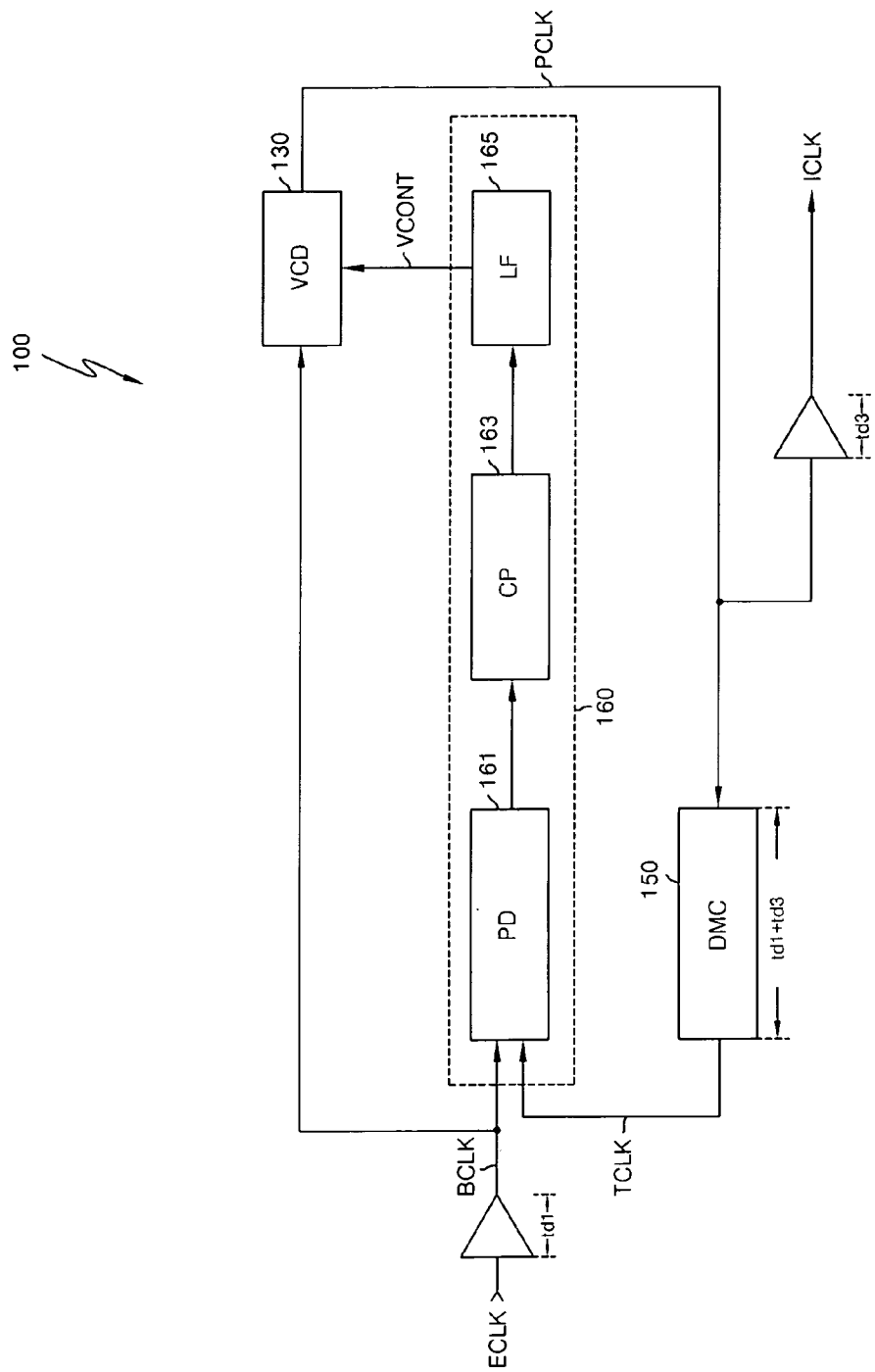
FIG. 1 is a block diagram of a conventional internal clock generation circuit.
Figure 2:
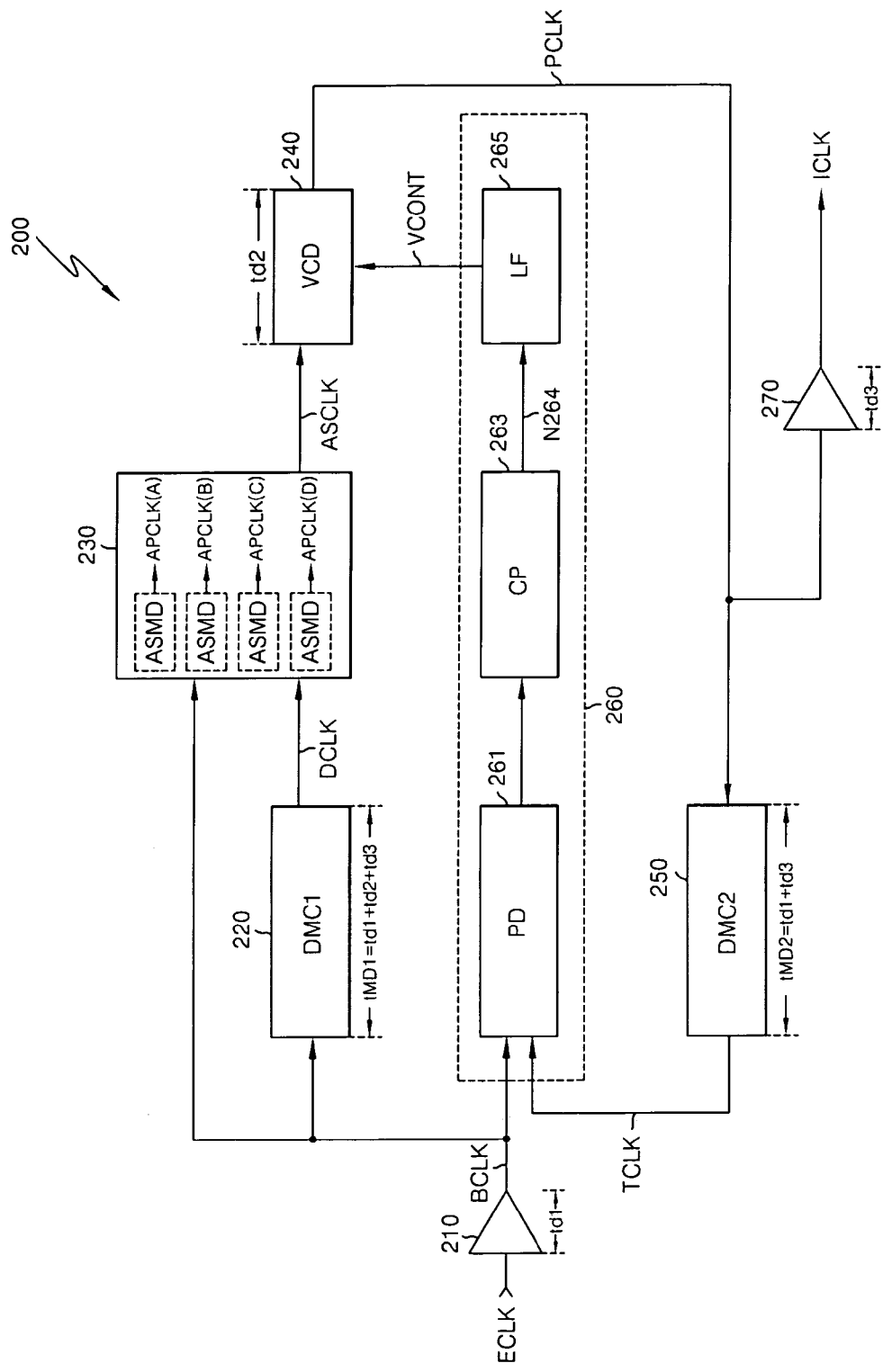
FIG. 2 is a schematic block diagram of an internal clock generation circuit according to first embodiments of the present invention.

FIG. 2 is a schematic block diagram of an internal clock generation circuit 200 according to first embodiments of the present invention. The internal clock generation circuit 200 may be used to provide an internal clock signal ICLK that is locked to an external reference clock signal ECLK. In the present specification, two clock signals may be referred to as being "locked" if the phases of the two clock signals substantially match each other. As shown in FIG. 2, the internal clock generation circuit 200 includes a first Delay Mirror Circuit (DMC1) 220, a coarse locking block 230, a Voltage Controlled Delay (VCD) block 240, a second Delay Mirror Circuit (DMC2) 250 and a fine locking block 260.

As is shown in FIG. 2, the internal clock generation circuit 200 may include an input buffer 210. The input buffer 210 may be used to buffer an external clock signal ECLK to generate a buffered clock signal BCLK. The buffered clock signal BCLK is offset from the external clock signal ECLK by a first transmission delay time td1. If the external clock signal ECLK is provided directly as the buffered clock signal BCLK, the first transmission delay time td1 is zero. Moreover, while in the embodiment depicted in FIG. 2, the first transmission delay time td1 is the delay time caused by the input buffer 210, it will be appreciated that other circuitry may be used to implement all or part of any first transmission delay time td1.

As is also shown in FIG. 2, the first delay mirror circuit 220 receives and delays the buffered clock signal BCLK by a first mirroring delay time tMD1 to generate a delayed clock signal DCLK. In the embodiment shown in FIG. 2, the first mirroring delay time tMD1 is equal to the sum of first, second and third transmission delay times td1, td2 and td3. As noted above, the first transmission delay time td1 is equal to the delay time between the external clock signal ECLK and the buffered clock signal BCLK. The second transmission delay time td2 represents the delay between a preliminary clock signal PCLK and an analog synchronous clock signal ASCLK. As shown in FIG. 2, the analog synchronous clock signal ASCLK is the output signal of the coarse locking block 230, and is provided to the VCD block 240 as an input signal. The preliminary clock signal PCLK is the output signal of the VCD block 240. Accordingly, the second transmission delay time td2 is equal to the delay time caused by the VCD block 240. The third transmission delay time td3 represents the delay between the internal clock signal ICLK and the preliminary clock signal PCLK. If the preliminary clock signal PCLK is directly provided as the internal clock signal ICLK, the third transmission delay time td3 is zero. As is also shown in FIG. 2, the internal clock generation circuit 200 may include an output buffer 270 that may be used to buffer the preliminary clock signal PCLK so as to generate a buffered preliminary clock signal as the internal clock signal ICLK. In this case, the third transmission delay time td3 may be the delay time caused by the output buffer 270.

The coarse locking block 230 receives the buffered clock signal BCLK and the delayed clock signal DCLK and generates the analog synchronous clock signal ASCLK. The coarse locking block 230 includes a plurality of analog synchronous mirror delay (ASMD) circuits that are driven to lock the detection clock signal TCLK, provided from the second DMC 250, to the buffered clock signal BCLK.

As shown in FIG. 2, the ASMD circuits generate analog output clock signals APCLK(A) to (D) that may be used to form the edges of the analog synchronous clock signal ASCLK. As discussed below, the logic states of the analog output clock signals APCLK(A) to (D) change based on the time at which first and second comparison signals VCOM1 and VCOM2 (refer to FIG. 4) are both discharged (during different intervals) to a certain discharge level.

Figure 3:
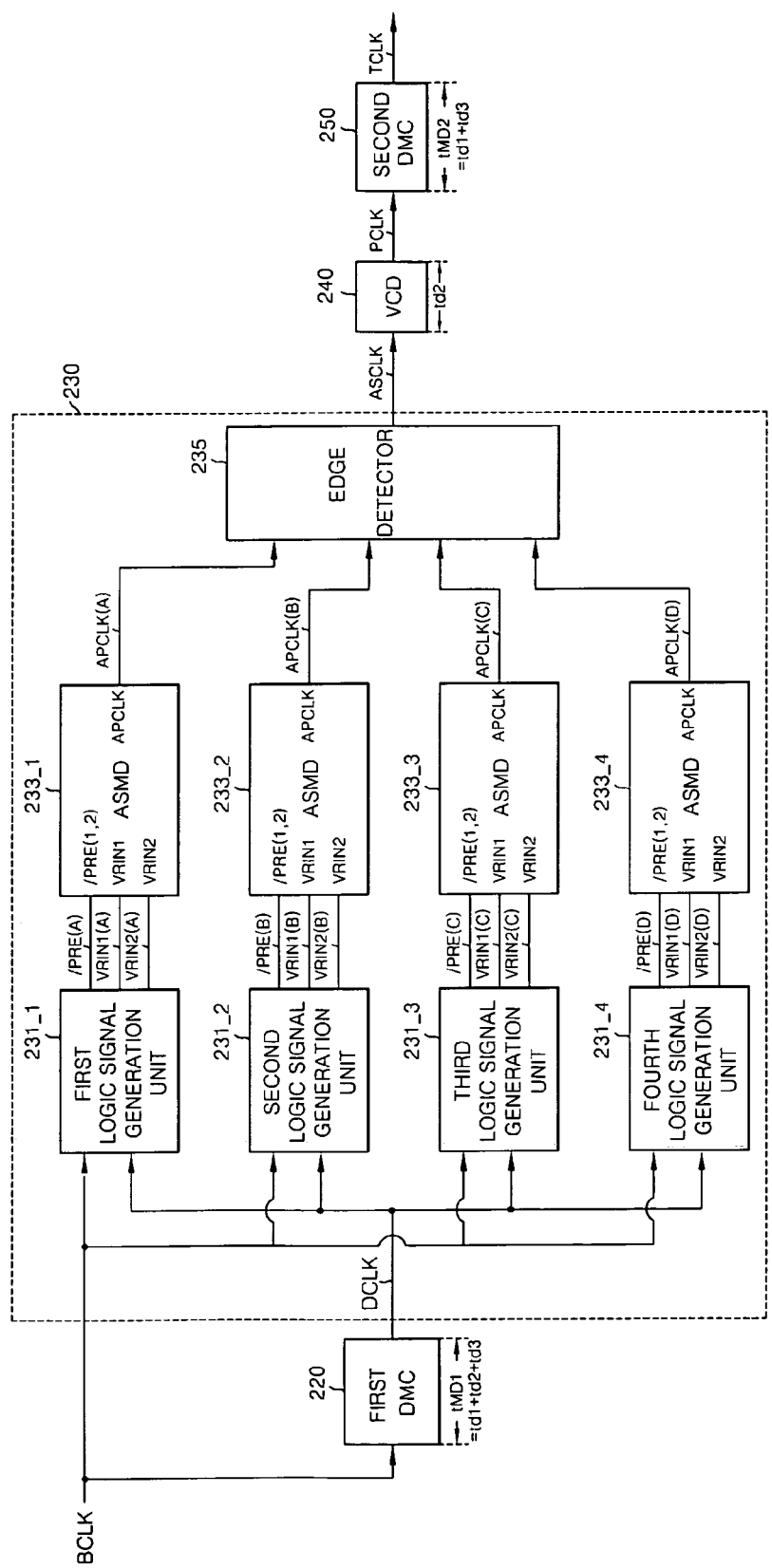
FIG. 3 is a block diagram of an implementation of the coarse locking block of FIG. 2 according to certain embodiments of the present invention.

A detailed description of the coarse locking block 230 is provided herein with reference to FIG. 3. A detailed description of the ASMD circuits is provided below with reference to FIG. 4 and FIGS. 5a to 5d.

Referring again to FIG. 2, the Voltage Controlled Delay (VCD) block 240 delays the analog synchronous clock signal ASCLK by the second transmission delay time td2 to generate the preliminary clock signal PCLK. The second transmission delay time td2 can be controlled by the voltage level of a voltage control signal VCONT that is provided from the fine locking block 260.

The second DMC 250 delays the preliminary clock signal PCLK by a second mirroring delay time tMD2 to generate the detection clock signal TCLK. The second mirroring delay time tMD2 may be equal to the sum of the first and third transmission delay times td1 and td3, and hence the second DMC 250 may be implemented by mirroring the input buffer 210 and the output buffer 270. The first mirroring delay time tMD1 of the first DMC 220 can be set to be equal to the sum of the second transmission delay time td2 and the second mirroring delay time tMD2.

The fine locking block 260 may be used to compare the phase of the buffered clock signal BCLK with the phase of the detection clock signal TCLK. The output of the fine locking block 260 may be a voltage control signal VCONT that has a voltage level which is based on the results of this comparison. Pursuant to embodiments of the present invention, the second transmission delay time td2 of the VCD block 240 can be precisely controlled using the voltage level of the voltage control signal VCONT provided from the fine locking block 260.

The fine locking block 260 includes a phase detector (PD) 261, a charge pump (CP) 263, and a loop filter (LF) 265. The phase detector 261 detects the phase lag or lead of the detection clock signal TCLK relative to the buffered clock signal BCLK. The charge pump 263 is responsive to the output of the phase detector 261, and controls the voltage level of an output signal N264 through charge pumping. The low frequency component of the output signal N264 of the charge pump 263 is passed by the loop filter 265, so that the passed signal is provided as the voltage control signal VCONT.

FIG. 3 is a block diagram of an implementation of the coarse locking block 230 of FIG. 2 according to certain embodiments of the present invention. As shown in FIG. 3, the coarse locking block 230 may include first to fourth ASMDs 233_1 to 233_4. The first ASMD 233_1 provides a first analog output clock signal APCLK(A) that may be used to lock the rising edges of the detection clock signal TCLK (refer to FIG. 2) in odd-numbered cycles to the rising edges of the buffered clock signal BCLK in odd-numbered cycles. The second ASMD 233_2 provides a second analog output clock signal APCLK(B) that may be used to lock the falling edges of the detection clock signal TCLK in odd-numbered cycles to the falling edges of the buffered clock signal BCLK in odd-numbered cycles. The third ASMD 233_3 provides a third analog output clock signal APCLK(C) that may be used to lock the rising edges of the detection clock signal TCLK in even-numbered cycles to the rising edges of the buffered clock signal BCLK in even-numbered cycles. The fourth ASMD 233_4 provides a fourth analog output clock signal APCLK(D) that may be used to lock the falling edges of the detection clock signal TCLK in even-numbered cycles to the falling edges of the buffered clock signal BCLK in even-numbered cycles.

Figure 4:
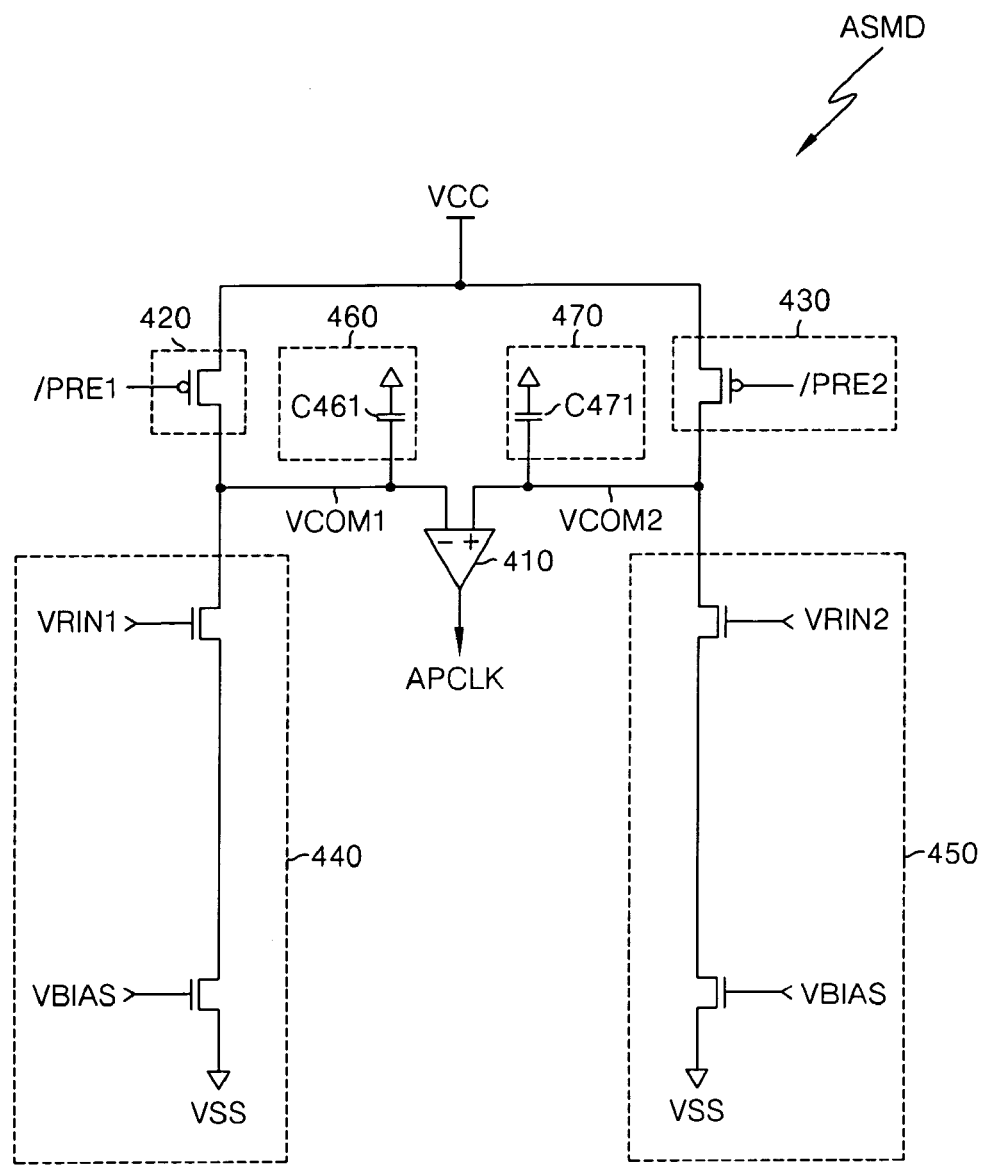
FIG. 4 is a circuit diagram of an implementation of one of the first to fourth analog synchronous mirror delay (ASMD) circuits of FIG. 3 according to certain embodiments of the present invention.

FIG. 4 is a detailed circuit diagram of one of the first to fourth ASMDs 233_1 to 233_4 of FIG. 3. As shown in FIG. 4, the ASMD includes a comparison unit 410, first and second precharge units 420 and 430, first and second discharge units 440 and 450, and first and second charge units 460 and 470.

The comparison unit 410 compares the voltage level of a first comparison signal VCOM1 with the voltage level of a second comparison signal VCOM2, and generates the analog output clock signal APCLK. The first precharge unit 420 precharges the first comparison signal VCOM1 in response to a first precharge signal /PRE1. The second precharge unit 430 precharges the second comparison signal VCOM2 in response to a second precharge signal /PRE2. In the particular embodiment depicted in FIG. 4, the voltage levels to which the first and second comparison signals VCOM1 and VCOM2 may be precharged is the supply voltage VCC.

The first and second precharge signals /PRE1 and /PRE2 can be activated at different times. As such, the first and second comparison signals VCOM1 and VCOM2 may be precharged to the supply voltage VCC at different times. It will also be understood that the first and second comparison signals VCOM1 and VCOM2 can be implemented with the same signal. In such an implementation, the first and second comparison signals VCOM1 and VCOM2 are precharged to the supply voltage VCC at the same time. In the description below, it is assumed that the first and second precharge signals /PRE1 and /PRE2 are implemented with the same precharge signal /PRE. However, it will be readily understood that separate precharge signals /PRE1 and /PRE2 may be used in other embodiments of the present invention.

In the embodiments of the ASMD circuits depicted in FIG. 4, the first discharge unit 440 may be used to discharge the first comparison signal VCOM1 in response to a first reference input signal VRIN1. The second discharge unit 450 may be used to discharge the second comparison signal VCOM2 in response to a second reference input signal VRIN2. In the depicted embodiment, the first and second discharge units 440 and 450 may perform discharge with the same "reference discharge capability." In the present specification, the "reference discharge capability" refers to the amount of charge of the first or second comparison signals VCOM1 and VCOM2 that is discharged per unit time when, for example, the starting voltage levels of the first and second reference input signals VRIN1 and VRIN2 are the supply voltage VCC.

The first and second charge units 460 and 470 charge the first and second comparison signals VCOM1 and VCOM2, respectively. The first and second charge units 460 and 470 may have the same charge capacity. In certain embodiments of the present invention, the first charge unit 460 may include a first capacitor C461 that is connected to the first comparison signal VCOM1, and the second charge unit 470 may include a second capacitor C471 that is connected to the second comparison signal VCOM2.

As shown in FIG. 3, in certain embodiments of the present invention, the first and second reference input signals VRIN1 and VRIN2 and the first and second precharge signals /PRE1 and /PRE2 (or the precharge signal /PRE if a single precharge signal is used) may be generated by logic signal generation units such as units 231_1 to 231_4 using logical combinations of the buffered clock signal BCLK and the delayed clock signal DCLK.

Each of the first to fourth ASMD circuits 233_1 to 233_4 may have the same structure. However, the timing of the signals that are input to and output from each of the four circuits may differ. Accordingly, in FIGS. 3 and 4, in order to distinguish input signals and output signals related to the first to fourth ASMD circuits 233_1 to 233_4 from each other, letters A, B, C and D are added in parentheses to provide unique reference numerals. Thus, for example, the first and second reference input signals VRIN1(A) and VRIN2(A) and the precharge signal /PRE(A) are provided to ASMD circuit 233_1 from the first logic signal generation unit 231_1. The first and second reference input signals VRIN1(A) and VRIN2(A) and the precharge signal /PRE(A) may be generated, for example, using logical combinations of the buffered clock signal BCLK and the delayed clock signal DCLK. Methods for generating the first and second reference input signals VRIN1(A) and VRIN2(A) and the precharge signal /PRE(A) are well known to those skilled in the art, so detailed descriptions of such operations will be omitted herein.

FIGS. 5a to 5d are timing charts illustrating operations of the ASMD circuits of FIG. 4 when the ASMD circuit acts as the first to fourth ASMD circuits 233_1 to 233_4 of FIG. 3, respectively. Note that in FIGS. 5a through 5d the signal 2*BCLK denotes a signal having the same duty cycle as the buffered clock signal BCLK and a period extended to twice that of the buffered clock signal BCLK. Similarly, the signal 2*DCLK denotes a signal having the same duty cycle as the delayed clock signal DCLK and a period extended to twice that of the delayed clock signal DCLK.

Figure 5A:
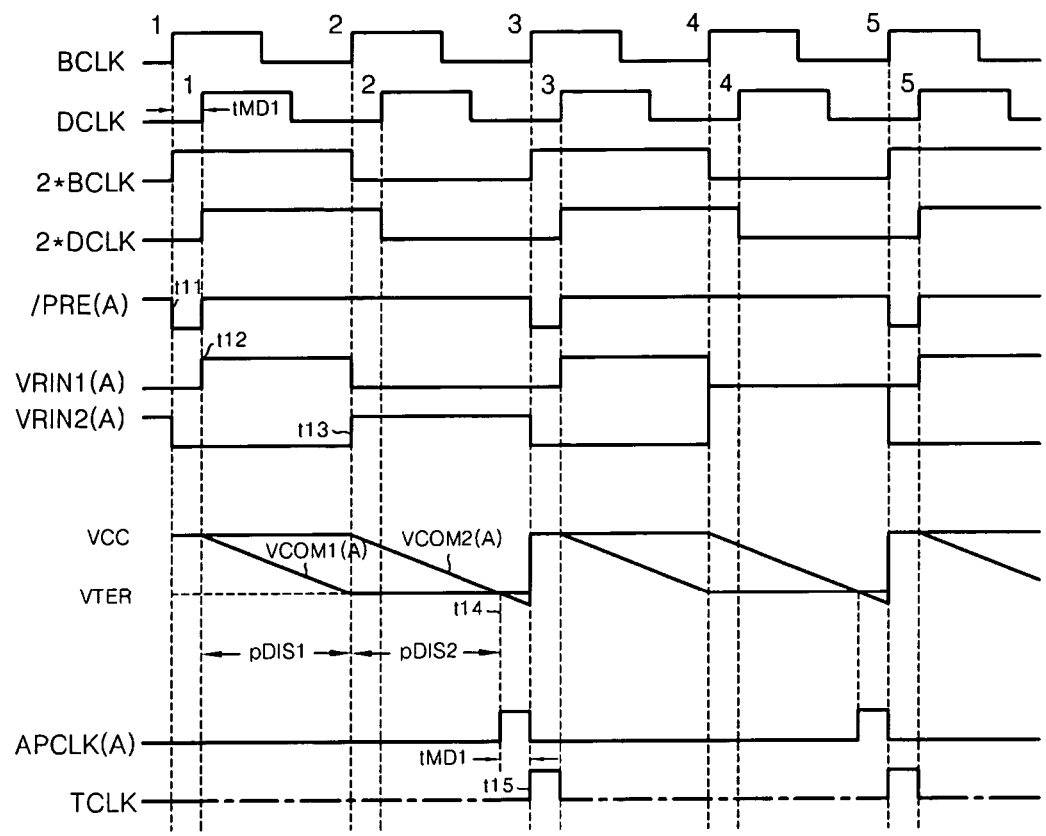
FIGS. 5a to 5d are timing diagrams illustrating operations of the analog synchronous mirror delay circuits of FIGS. 3 and 4.

Next, the operation of the first ASMD 233_1 is described with respect to FIG. 5a. At point t11, when the logic level of the precharge signal /PRE(A) (i.e., the input signal that is applied to the first precharge unit 420 and to the second precharge unit 430 of ASMD circuit 321_1) is changed to a logic L state, the first and second comparison signals VCOM1(A) and VCOM2(A) are precharged to the supply voltage VCC. At point t12, the logic level of the precharge signal /PRE(A) is changed to a logic H state, and the logic level of the first reference input signal VRIN1(A) is changed to a logic H state. As a result, the voltage level of the first comparison signal VCOM1(A) starts to decrease with a predetermined reference discharge capability. The decrease of the voltage level of the first comparison signal VCOM1(A) continues during a first discharge interval pDIS1, so that the voltage level of the first comparison signal VCOM1(A) reaches a predetermined discharge voltage level VTER. As shown in FIG. 5a, during the first discharge interval pDIS1, the second reference input signal VRIN2(A) maintains a logic L state, so that the second comparison signal VCOM2(A) maintains the supply voltage VCC.

At the end of the first discharge interval DISI (i.e., at point t13), which corresponds to the rising edge of the second cycle of the buffered clock signal BCLK, the voltage level of the first reference input signal VRIN1(A) is changed to a logic L state. As a result, the first comparison signal VCOM1(A) stops discharging and maintains the discharge voltage level VTER. At this time (i.e., at point t13) the voltage level of the second reference input signal VRIN2(A) is changed to a logic H state, turning on the second discharge unit 450. As such, the voltage level of the second comparison signal VCOM2(A) starts to decrease with the reference discharge capability. At point tl4, the voltage level of the second comparison signal VCOM2(A) reaches the discharge voltage level VTER, and becomes equal to that of the first comparison signal VCOM1(A). As is also shown in FIG. 5a, since both the first and second comparison signals VCOM1(A) and VCOM2(A) are discharged with the reference discharge capability, the length of an interval pDIS2 between the points t13 and t14 is equal to that of the first discharge interval pDIS1.

The analog output clock signal APCLK(A) provides the rising edges of the detection clock signal TCLK in odd-numbered clock cycles starting from a third clock cycle. At this time, the delay time of the detection clock signal TCLK from the analog output clock signal APCLK(A) is equal to the sum of the second transmission delay time td2 of the voltage controlled delay block 240 and the second mirroring delay time tMD2 of the second DMC 250. Therefore, the delay time of the detection clock signal TCLK from the analog output clock signal APCLK(A) corresponds to the first mirroring delay time, that is, tMD1=tMD2+td2=td1+td2+td3 (see FIG. 3).

Therefore, as shown in FIG. 5a, the rising edges of the detection clock signal TCLK in odd-numbered clock cycles are locked to the rising edges of the buffered clock signal BCLK in odd-numbered clock cycles after the third clock cycle of TCLK.

Figure 5B:
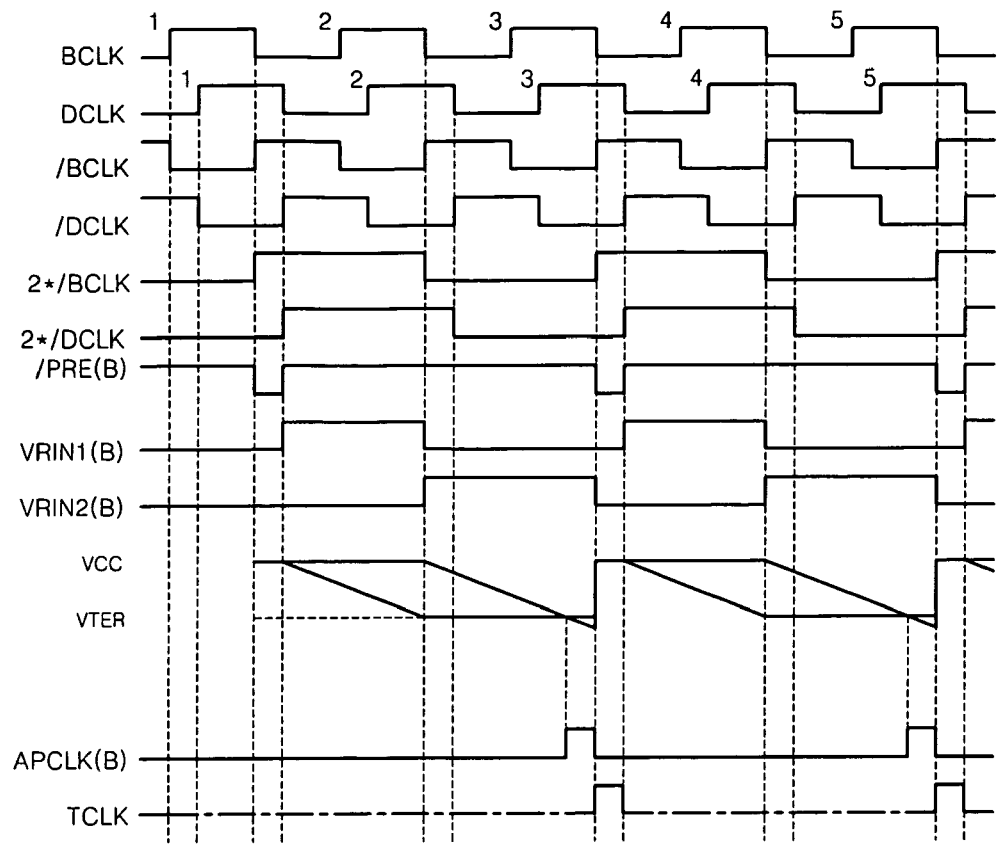

Next, referring to FIG. 5b, it can be seen that the second logic signal generation unit 231_2 and the second ASMD circuit 233_2 may be used to generate an analog output clock signal APCLK(B) that is used to lock the falling edges of the detection clock signal TCLK in odd-numbered clock cycles to the falling edges of the buffered clock signal BCLK in odd-numbered clock cycles after the third clock cycle of TCLK.

Figure 5C:
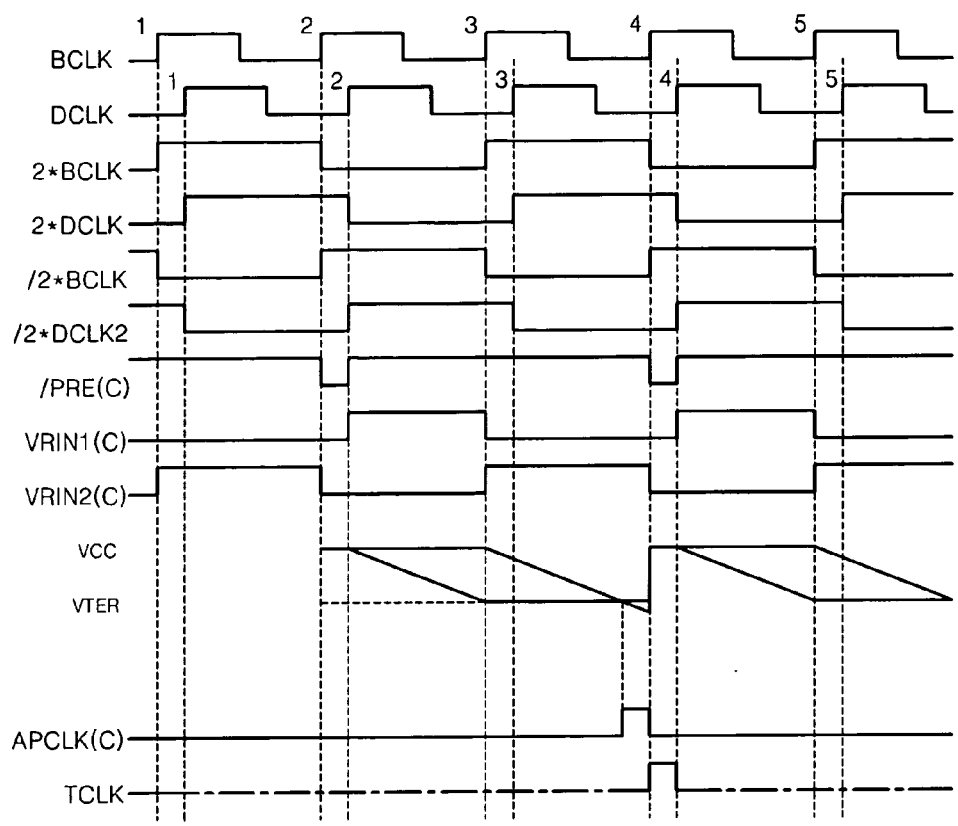

Similarly, as shown in FIG. 5c, it can be seen that the third logic signal generation unit 231_3 and the third ASMD circuit 233_3 may be used to generate an analog output clock signal APCLK(C) that is used to lock the rising edges of the detection clock signal TCLK in even-numbered clock cycles to the rising edges of the buffered clock signal BCLK in even-numbered clock cycles after the third clock cycle of TCLK.

Figure 5D:
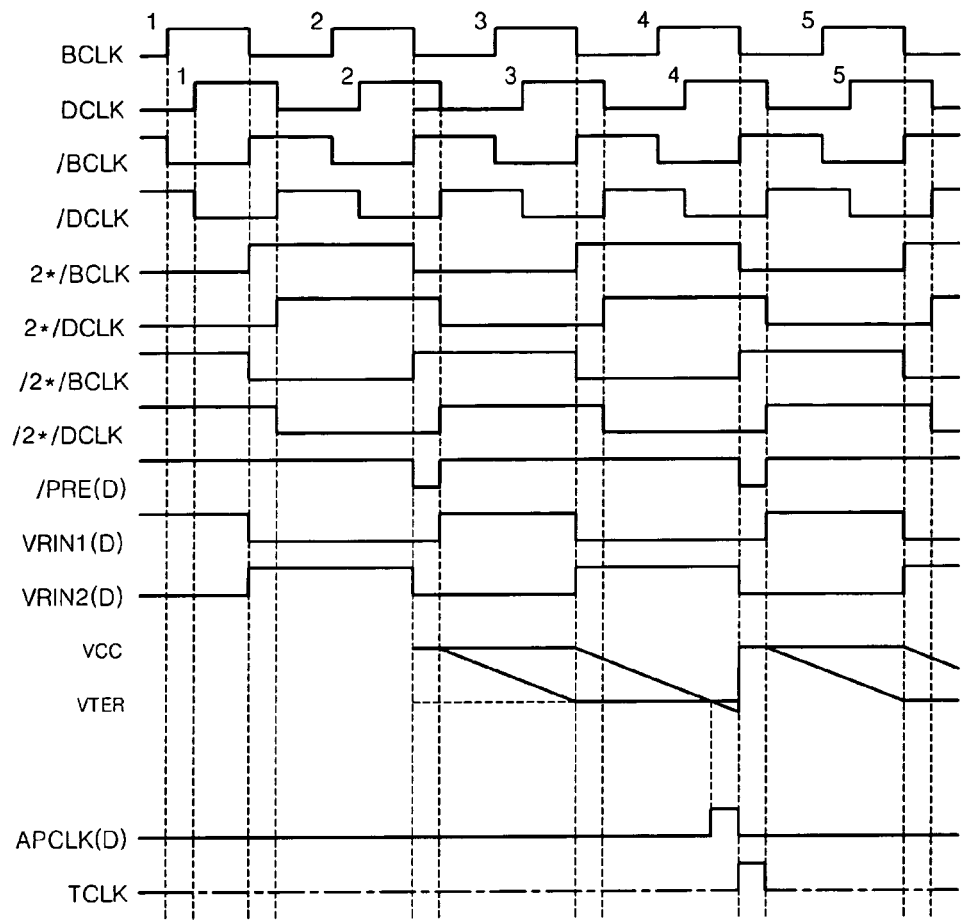

Finally, as shown in FIG. 5d, it can be seen that the fourth logic signal generation unit 231_4 and the fourth ASMD circuit 233_4 may be used to generate an analog output clock signal APCLK(D) that is used to lock the falling edges of the detection clock signal TCLK in even-numbered clock cycles to the falling edges of the buffered clock signal BCLK in even-numbered clock cycles after the third clock cycle of TCLK.

The operation of the second to fourth logic signal generation units 231_2 to 231_4 and the second to fourth ASMD circuits 233_2 to 233_4 can be easily understood by referring to the operation of the first logic signal generation unit 231_1 and the first ASMD circuit 233_1 described with reference to FIG. 5*a*. Therefore, in the present specification, detailed descriptions of the operation of the second to fourth logic signal generation units 231_2 to 231_4 and the second to fourth ASMD circuits 233_2 to 233_4 are omitted.

Note that while FIG. 3 depicts an embodiment in which four separate logic signal generation units 231_1 through 231_4 are provided, it will be understood that the logic signal generation units 231_1 to 231_4 can be integrated, for example, into a single unit.

Referring again to FIG. 3, the edge detector 235 detects the analog output clock signals APCLK(A) to APCLK(D) output from the first to fourth ASMD circuits 233_1 to 233_4, and generates the analog synchronous clock signal ASCLK having the same duty cycle and period as the buffered clock signal BCLK.

Figure 6:
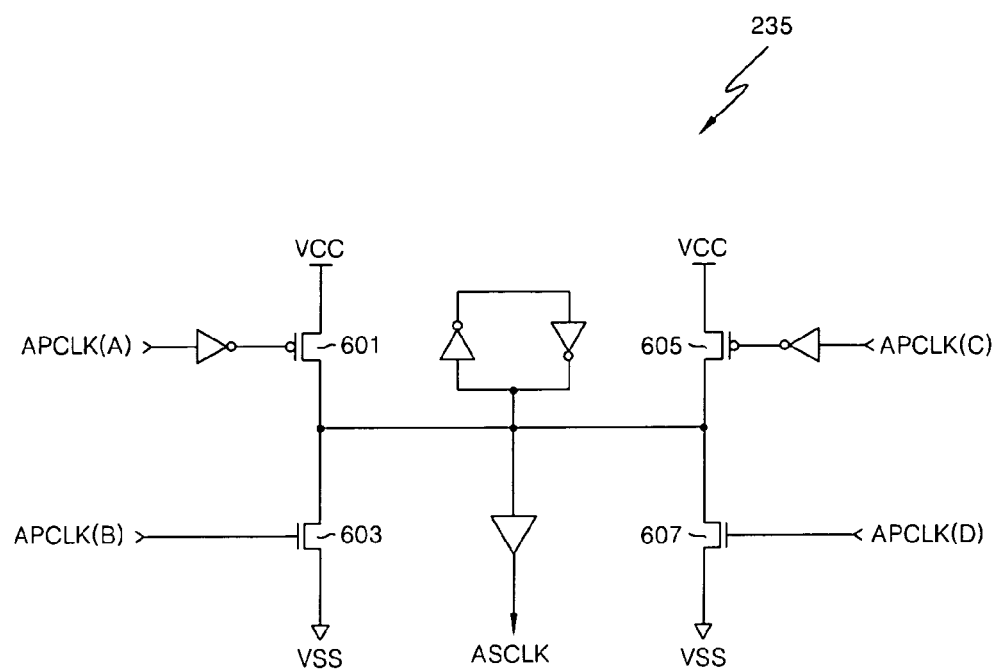
FIG. 6 is a circuit diagram of an implementation of the end detector of FIG. 3 according to certain embodiments of the present invention.
Figure 7:
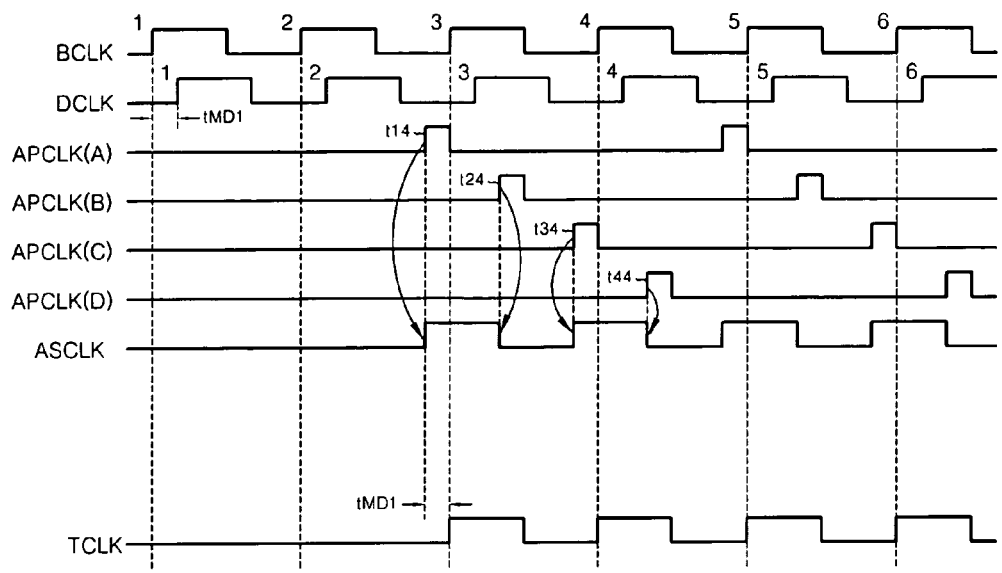
FIG. 7 is a timing diagram illustrating operations of the end detector of FIG. 6.

FIGS. 6 and 7 are a circuit diagram and a timing diagram showing the construction and operation, respectively, of an implementation of the edge detector 235 of FIG. 3 according to certain embodiments of the present invention.

As shown in FIG. 7, at point t14, the voltage level of the first analog output clock signal APCLK(A) that is output from the first ASMD circuit 233_1 (see FIG. 3) is changed to a logic H state, as described above. As shown in FIG. 6, when this occurs, a first PMOS transistor 601 is turned on, which causes the voltage level of the analog synchronous clock signal ASCLK to change to a logic H state.

As is also shown in FIG. 7, at point t24, the voltage level of the analog output clock signal APCLK(B) that is output from the second ASMD circuit 233_2 is changed to a logic H state. As shown in FIG. 6, when this occurs, a first NMOS transistor 603 is turned on, which causes the voltage level of the analog synchronous clock signal ASCLK to change to a logic L state.

As is further shown in FIG. 7, at point t34, the voltage level of the analog output clock signal APCLK(C) that is output from the third ASMD circuit 233_3 is changed to a logic H state. As shown in FIG. 6, when this occurs, a second PMOS transistor 605 is turned on, which causes the voltage level of the analog synchronous clock signal ASCLK to change to a logic H state.

As is also shown in FIG. 7, at point t44, the voltage level of the analog output clock signal APCLK(D) that is output from the fourth ASMD circuit 233_4 is changed to a logic H state. As shown in FIG. 6, when this occurs, a second NMOS transistor 607 is turned on which causes the voltage level of the analog synchronous clock signal ASCLK to change to a logic L state.

Through the operation of the edge detector 235, the analog synchronous clock signal ASCLK has the same duty cycle as the buffered clock signal BCLK. Further, as described above, the detection clock signal TCLK is delayed from the analog synchronous clock signal ASCLK by the first mirroring delay time tMD1. Therefore, the detection clock signal TCLK is locked to the buffered clock signal BCLK from the third clock cycle thereof, that is, after a locking time corresponding to two clock cycles of the buffered clock signal BCLK.

Figure 8:
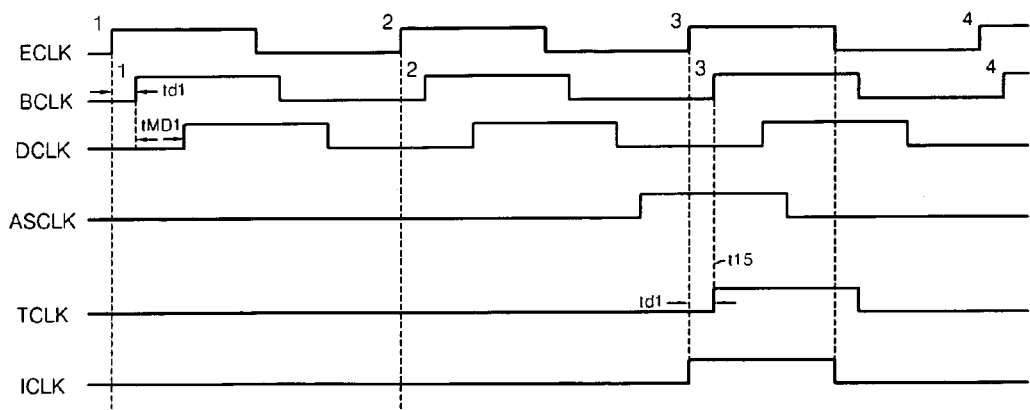
FIG. 8 is a timing diagram illustrating operations of the internal clock generation circuit of FIG. 2.

FIG. 8 is an operating timing diagram of an internal clock generator 200 of FIG. 2, which shows that an internal clock signal ICLK may be locked to an external clock signal ECLK after a locking time corresponding to two clock cycles of the external clock signal ECLK.

Referring to FIG. 8, at point t15, the detection clock signal TCLK is coarsely locked to the buffered clock signal BCLK, as described above. In particular, the external clock signal ECLK precedes the buffered clock signal BCLK by the first transmission delay time td1. Further, as shown in FIG. 2, the internal clock signal ICLK precedes the detection clock signal TCLK by the first transmission delay time td1. As such, the locking of the detection clock signal TCLK to the buffered clock signal BCLK means that the internal clock signal ICLK is locked to the external clock signal ECLK.

Thus, using the internal clock generation circuit 200 according to embodiments of the present invention, the internal clock signal ICLK may be coarsely locked to the external clock signal ECLK from the third clock cycle thereof, that is, after a locking time corresponding to two clock cycles. Thereafter, the internal clock signal ICLK may be finely locked to the external clock signal ECLK by the fine locking block 260 and the voltage controlled delay block 240.

The ASMD included in the internal clock generation circuit 200 according to the first embodiments of the present invention may have a fixed discharge capability. When the period of the external clock signal ECLK is considerably lengthened (i.e., when the external clock signal ECLK is a low frequency signal), the discharge voltage VTER of the first comparison signal VCOM1 may be equal to the ground voltage VSS. Moreover, the time at which the first comparison signal VCOM1 reaches the ground voltage VSS may precede the time that the second comparison signal VCOM2 starts to be discharged, that is, the point t13 (see FIG. 5*a*). In such a situation, the lengths of the intervals pDIS1 and pDIS2 differ, so that the internal clock signal ICLK cannot be locked to the external clock signal ECLK.

Likewise, when the period of the external clock signal ECLK is greatly shortened (i.e., when the external clock signal ECLK is a high frequency signal), a difference between the discharge voltage VTER of the first comparison signal VCOM1 and the supply voltage VCC may be very small. This may make it difficult to accurately compare the voltage levels of the first and second comparison signals VCOM1 and VCOM2 with each other.

According to second embodiments of the present invention, internal clock generation circuits 200 may be provided that may provide enhanced performance in low frequency and/or in high frequency applications.

Figure 9:
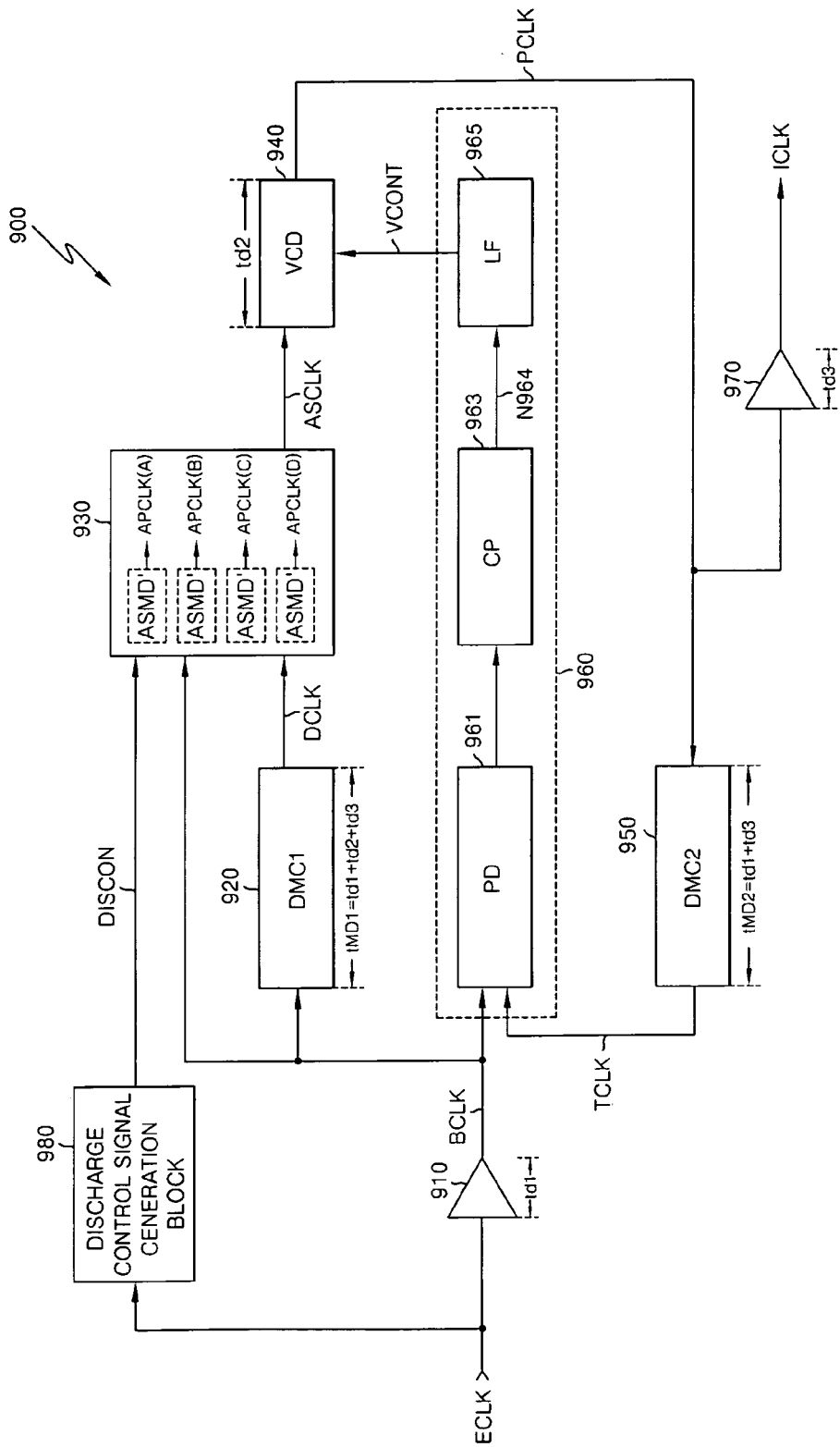
FIG. 9 is a block diagram of an internal clock generation circuit according to second embodiments of the present invention.

FIG. 9 is a block diagram of an internal clock generation circuit 900 according to second embodiments of the present invention. The internal clock generation circuit 900 of FIG. 9 is similar to the internal clock generation circuit 200 of FIG. 2 that is described above. However, in the internal clock generation circuit 900 of FIG. 9, the coarse locking block 930 is controlled in response to a discharge control signal DISCON. As is also shown in FIG. 9, the internal clock generation circuit 900 of FIG. 9 may include a discharge control signal generation block 980 for generating the discharge control signal DISCON. As discussed herein, the discharge control signal DISCON may be a signal that has a logic level which is controlled by the frequency of, for example, a first clock cycle of the external clock signal ECLK. Consequently, the reference discharge capability of each ASMD circuit in the coarse locking block 930 may be actively varied according to frequency variation in the external clock signal ECLK.

The construction and operation of other components in the internal clock generation circuit 900 of FIG. 9 may be the same as the construction and operation of the similarly-titled blocks included in the internal clock generation circuit 200 of FIG. 2. Therefore, in the present specification, detailed description of the remaining blocks of FIG. 9 is omitted.

Figure 10:
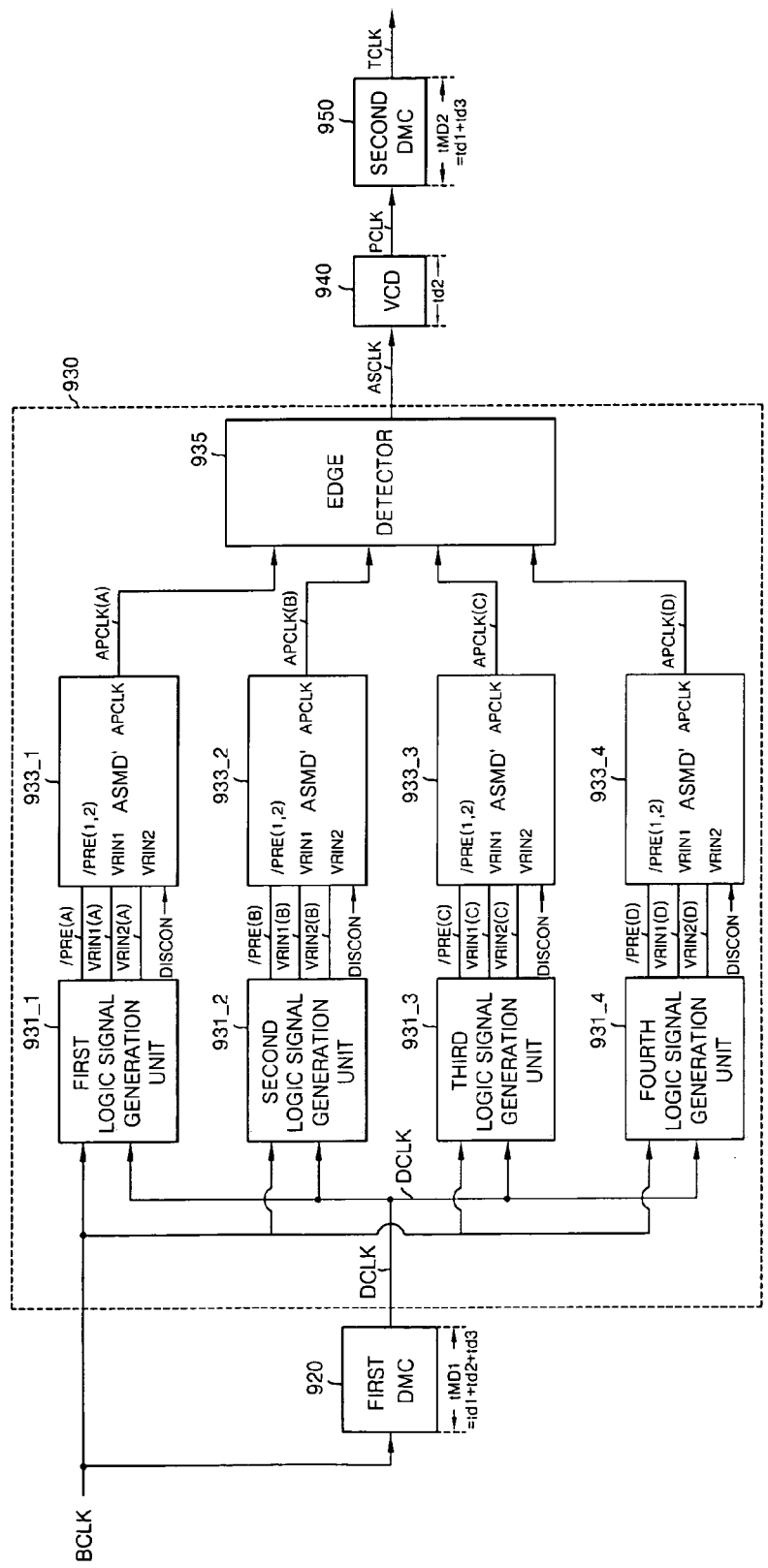
FIG. 10 is a block diagram of an implementation of the coarse locking block of FIG. 9 according to certain embodiments of the present invention.

FIG. 10 is a block diagram of an implementation of the coarse locking block 930 of FIG. 9 according to certain embodiments of the present invention. The coarse locking block 930 of FIG. 10 is similar to the coarse locking block 230 of FIG. 3, except that in the coarse locking block 930 of FIG. 10, the reference discharge capability of ASMD circuits 933_1 to 933_4 are controlled by the discharge control signal DISCON. Thus, the reference discharge capacity of the ASMD circuits 933_1 to 933_4 may be actively varied according to frequency variation in the external clock signal ECLK.

The construction and operation of other components of the coarse locking block 930 of FIG. 10 may be the same as the construction and operation of the similarly-titled blocks included in the coarse locking block 230 of FIG. 3. Therefore, in the present specification, detailed description of the remaining blocks of FIG. 10 is omitted.

Figure 11:
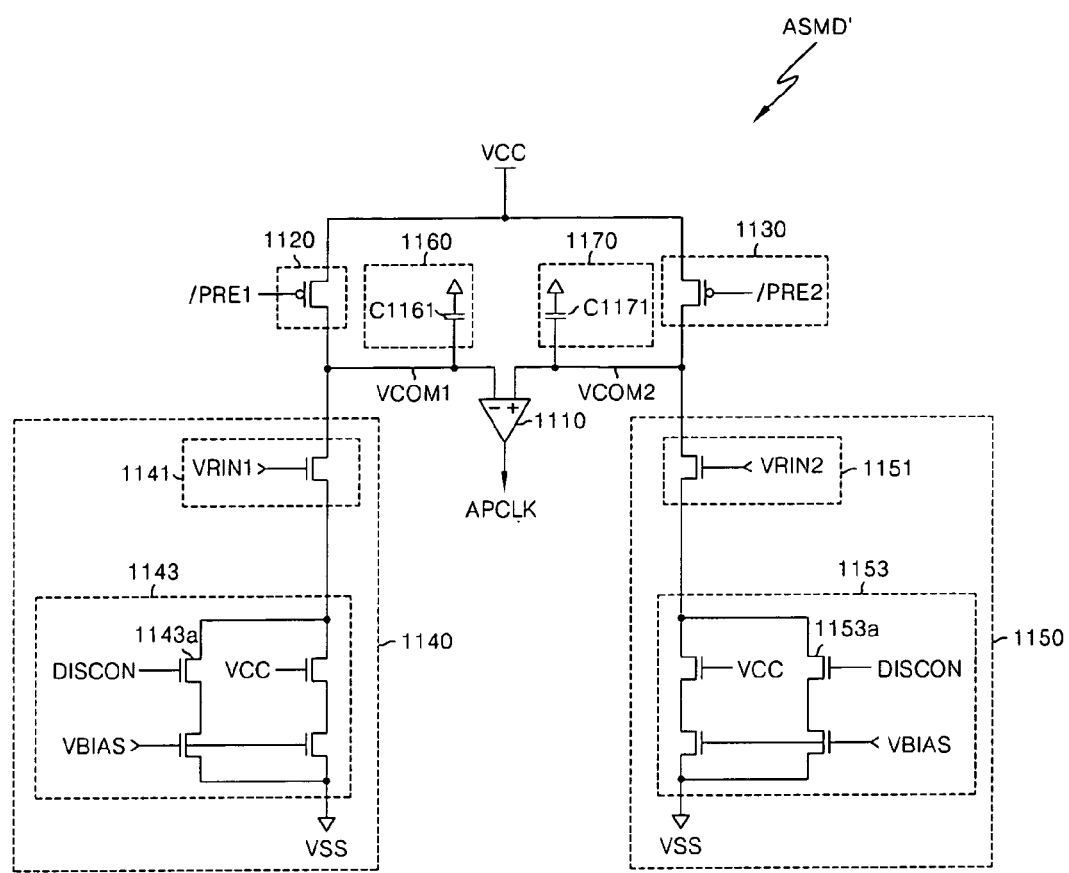
FIG. 11 is a circuit diagram of an implementation of one of the analog synchronous mirror delay circuits of FIG. 10 according to certain embodiments of the present invention.

FIG. 11 is a circuit diagram of one of the ASMD circuits 933_1 to 933_4 of FIG. 10. As shown in FIG. 11, the ASMD circuits may include a comparison unit 1110, first and second precharge units 1120 and 1130, first and second discharge units 1140 and 1150, and first and second charge units 1160 and 1170.

The comparison unit 1110, the first and second precharge units 1120 and 1130, and the first and second charge units 1160 and 1170 may have the same construction and operation as the comparison unit 410, the first and second precharge units 420 and 430, and the first and second charge units 460 and 470 of the ASMD circuit of FIG. 4, respectively. Therefore, in the present specification, detailed description of the these units of FIG. 11 is omitted. In contrast, the first and second discharge units 1140 and 1150 differ from the first and second discharge units 440 and 450 of FIG. 4.

In particular, the first discharge unit 1140 may be used to discharge the first comparison signal VCOM1 in response to a first reference input signal VRIN1. Likewise, the second discharge unit 1150 may be used to discharge the second comparison signal VCOM2 in response to a second reference input signal VRIN1. In addition, the reference discharge capability of the first and second discharge units 1140 and 1150 is controlled by the discharge control signal DISCON.

The first discharge unit 1140 includes a first discharge block 1141 and a first current source 1143. The second discharge unit 1150 includes a second discharge block 1151 and a second current source 1153. The first discharge block 1141 discharges the first comparison signal VCOM1 in response to the first reference input signal VRIN1. The second discharge block 1151 discharges the second comparison signal VCOM2 in response to the second reference input signal VRIN2.

The first current source 1143 allows the charge, provided from the first discharge block 1141 and discharged by the first comparison signal VCOM1, to flow at the reference discharge capability. Similarly, the second current source 1153 allows the charge, provided from the second discharge block 1151 and discharged by the second comparison signal VCOM2, to flow at the reference discharge capability.

In this case, the reference discharge capability of the first and second current sources 1143 and 1153 is controlled in response to the discharge control signal DISCON.

That is, when the discharge control signal DISCON is in a logic H state, NMOS transistors 1143a and 1153a are turned on, so that the reference discharge capability becomes relatively high. In contrast, when the discharge control signal DISCON is in a logic L state, the NMOS transistors 1143a and 1153a are turned off, so that the reference discharge capability becomes relatively low.

In this way, the reference discharge capability may be varied according to the logic level of the discharge control signal DISCON, which in turn, is based on the frequency of the external clock signal ECLK.

Figure 12:
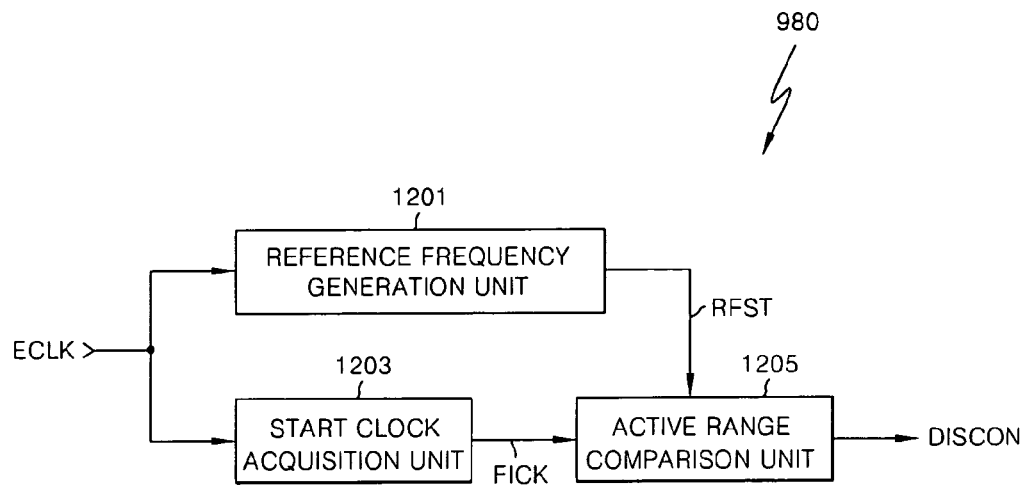
FIG. 12 is a block diagram of an implementation of the discharge control signal generation block of FIG. 9 according to certain embodiments of the present invention.

FIG. 12 is a block diagram of an implementation of the discharge control signal generation block 980 of FIG. 9 according to certain embodiments of the present invention. The discharge control signal generation block 980 includes a reference frequency generation unit 1201, a start clock acquisition unit 1203 and an active range comparison unit 1205.

The reference frequency generation unit 1201 generates a reference frequency signal RFST having a predetermined active range in response to, for example, the rising edge of the first clock cycle of the external clock signal ECLK. The start clock acquisition unit 1203 acquires the first clock cycle of the external clock signal ECLK to generate a clock start signal FICK.

The active range comparison unit 1205 receives the reference frequency signal RFST and the clock start signal FICK and ultimately generates the discharge control signal DISCON. Thus, in certain embodiments of the present invention, the discharge control signal DISCON may have a logic state that is based on a ratio of the width of the active range of the clock start signal FICK to the width of the active range of the reference frequency signal RFST.

Figure 13:
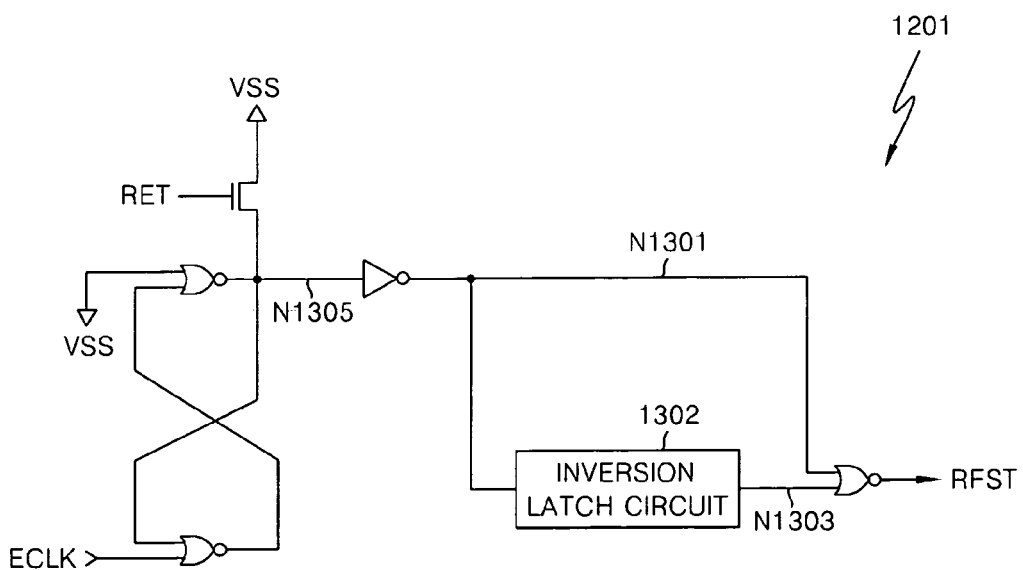
FIG. 13 is a circuit diagram of an implementation of the reference frequency generation unit of FIG. 12 according to certain embodiments of the present invention.

FIG. 13 is a circuit diagram of an implementation of the reference frequency generation unit 1201 of FIG. 12 according to certain embodiments of the present invention. Referring to FIG. 13 together with FIGS. 15a and 15b, the logic level of a signal on a terminal N1301 is changed to a logic L state in response to the rising edge of, for example, the first cycle of the external clock signal ECLK, and thereafter maintains the logic L state. Further, an inversion latch circuit 1302 may be used to invert and delay the signal of the terminal N1301 by a predetermined control delay time tCON, and provides the inverted and delayed signal to a terminal N1303 as an input signal thereof. Therefore, the reference frequency signal RFST, which is the output signal of the reference frequency generation unit 1201, is activated once by the active range of the control delay time tCON.

Figure 14:
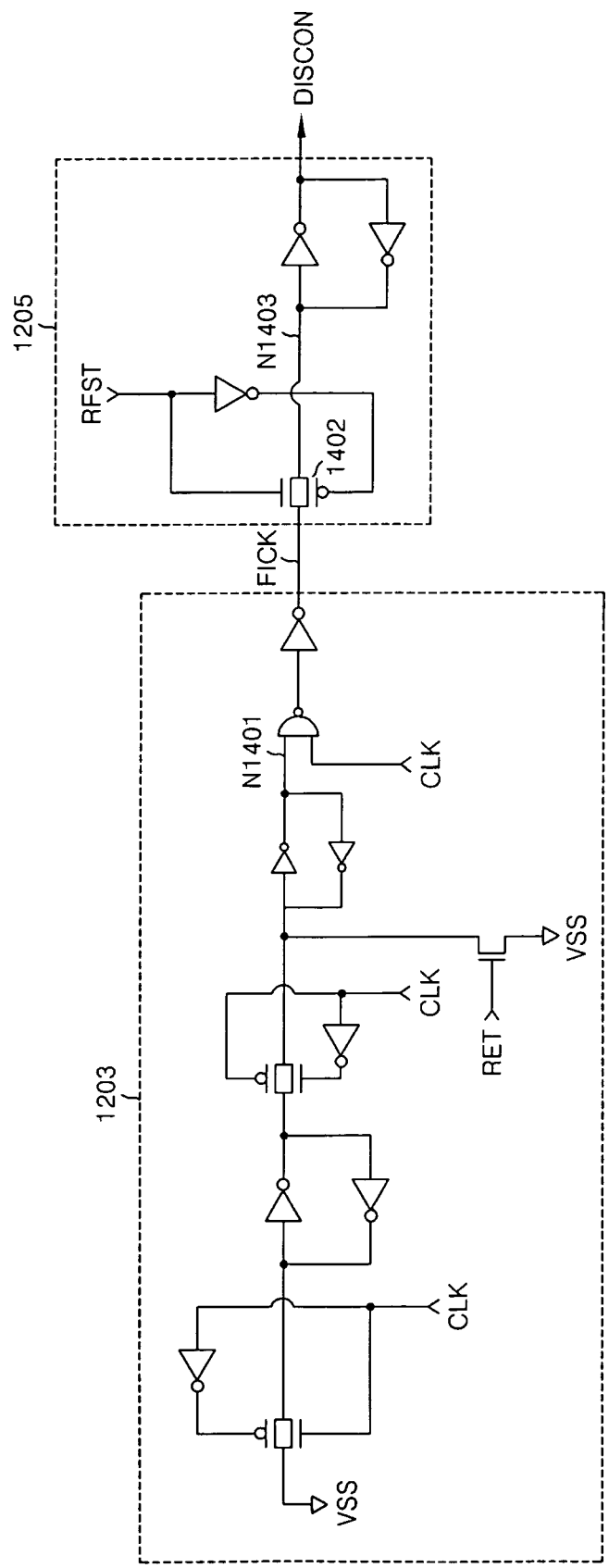
FIG. 14 is a circuit diagram of an implementation of the start clock acquisition unit and the active range comparison unit of FIG. 12 according to certain embodiments of the present invention.

FIG. 14 is a circuit diagram of implementations of the start clock acquisition unit 1203 and the active range comparison unit 1205 of FIG. 12 according to certain embodiments of the present invention. Referring to FIG. 14 together with FIGS. 15a and 15b, the logic level of a signal on a terminal N1401 is changed from a logic H state to a logic L state in response to the falling edge of the first clock cycle of the external clock signal ECLK. Thereafter, the signal on the terminal N1401 maintains the logic L state. Therefore, the clock start signal FICK, which is the output signal of the start clock acquisition unit 1203, is identical to the external clock signal ECLK in the first clock cycle.

Further, the clock start signal FICK is transmitted by a transmission gate 1402 in an interval during which the reference frequency signal RFST is in a logic H state. Further, the output signal N1403 of the transmission gate 1402 is inverted and latched, and the inverted and latched signal is output as the discharge control signal DISCON.

Figure 15A:
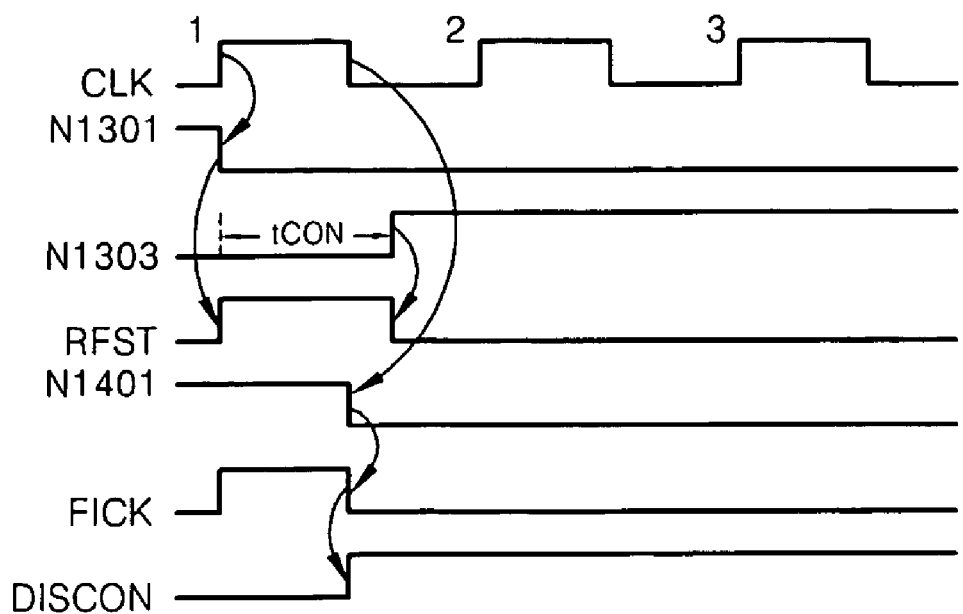
FIGS. 15a and 15b are timing diagrams illustrating the timing of certain of the signals of FIGS. 12 to 14.

Consequently, as shown in FIG. 15a, when the external clock signal ECLK is a high frequency signal, the logic level of the discharge control signal DISCON is changed to a logic H state. Therefore, the reference discharge capability of the ASMD of the coarse locking block 930 becomes relatively high, allowing the internal clock generation circuit 900 to operate properly with a high frequency signal.

Figure 15B:
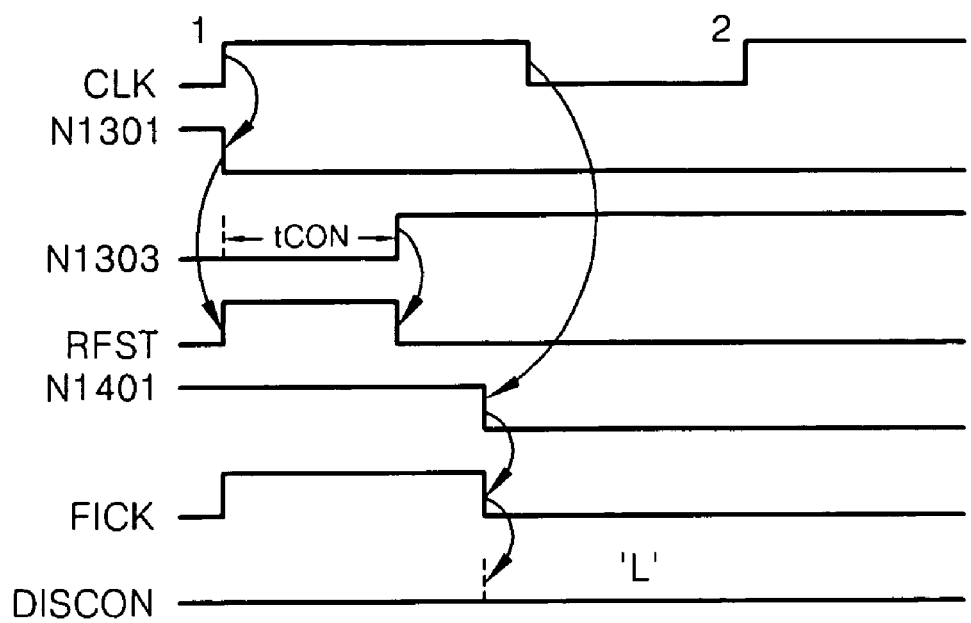

As shown in FIG. 15*b*, when the external clock signal ECLK is a low frequency signal, the logic level of the discharge control signal DISCON is changed to a logic L state. Therefore, the reference discharge capability of the ASMD of the coarse locking block 930 becomes relatively low, allowing the internal clock generation circuit 900 to operate properly with a low frequency signal.

In FIGS. 13 and 14, a signal RET is a signal used to reset the terminal N1305 to the ground voltage VSS. The signal RET may be a pulse signal that is generated, for example, before the first clock cycle of the external clock signal ECLK.

In the ASMD circuit included in the internal clock generation circuit 900, the reference discharge capability may actively vary according to frequency variation in the external clock signal ECLK. As a result, the ASMD circuit can actively cope with frequency variation in the received external clock signal, and may have a wide operating range.

Although certain embodiments of the present invention have been disclosed for illustrative purposes, those skilled in the art will appreciate that various modifications, additions and substitutions are possible.

For example, in the present specification, embodiments of an ASMD circuit, in which first and second comparison signals are precharged to the supply voltage VCC and are discharged to the ground voltage VSS, are depicted and described. However, it will be understood that in alternative embodiments of the present invention the first and second comparison signals may be precharged to the ground voltage VSS and are discharged to the supply voltage VCC.

Further, in the present specification, embodiments in which a coarse locking block includes 4 ASMD circuits and an edge detector are depicted and described. However, it will likewise be understood that in further embodiments of the present invention the coarse locking block may, for example, comprise a single ASMD circuit.

Likewise, in the present specification, embodiments are described in which the reference discharge capability is controlled by a single discharge control signal. However, it will be appreciated that the reference discharge capability can be adjusted to various levels in other embodiments in which a plurality of discharge control signals are used.

Likewise, in certain of the embodiments of the present invention described herein, a discharge control signal generation block 980 receives the external clock signal ECLK and the logic level of the discharge control signal DISCON is controlled according to the frequency of a first clock cycle of the external clock signal ECLK. However, it will be understood that in alternative embodiments of the present invention the discharge control signal generation block 980 may instead receive the buffered clock signal BCLK or the delayed clock signal DCLK, and the logic level of the discharge control signal DISCON may be controlled according to the frequency of a first (or other) clock cycle of the buffered clock signal BCLK or the delayed clock signal DCLK.

According to embodiments of the present invention, an internal clock generation circuit includes a coarse locking block. Further, an internal clock signal provided from the internal clock generation circuit of the present invention is coarsely locked to an external clock signal from a third clock cycle thereof, that is, after a locking time corresponding to two clock cycles, by the coarse locking block.

Further, ASMD circuits according to embodiments of the present invention may include a discharge capability that actively varies according to frequency variation in the external clock signal. Such ASMD circuits are suitable for operation with a wide range of operating ranges, in that the ASMD circuits can actively cope with frequency variation in the received external clock signal.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A clock generation circuit, comprising:
a first delay circuit that is responsive to a first clock signal;
a coarse locking circuit that includes at least one analog synchronous mirror delay circuit, the coarse locking circuit responsive to an output from the first delay circuit and to the first clock signal;
a voltage controlled delay circuit that is responsive to an output of the coarse locking circuit and to a voltage control signal;
a second delay circuit that is responsive to an output of the voltage controlled delay circuit;
a fine locking circuit that is responsive to an output of the second delay circuit and the first clock signal that is configured to generate the voltage control signal;
a third delay circuit responsive to the output of the voltage controlled delay circuit; and
a fourth delay circuit that is configured to generate the first clock signal from an external clock signal,
wherein the first delay circuit is configured to delay the first clock signal by a first mirror delay time that is equal to the sum of a first transmission delay time, a second transmission delay time and a third transmission delay time, wherein the voltage controlled delay circuit is configured to delay the output of the coarse locking circuit by the second transmission delay time, wherein the second delay circuit is configured to delay the output of the voltage controlled delay circuit by a second mirror delay time that is equal to the sum of the first transmission delay time and the third transmission delay time, wherein the third delay circuit is configured to delay the output of the voltage controlled delay circuit by the third transmission delay time, and wherein the fourth delay circuit is configured to delay the external clock signal by the first transmission delay time to generate the first clock signal.

2. A clock generation circuit, comprising:
a first delay circuit that is responsive to a first clock signal;
a coarse locking circuit that comprises
at least one logic circuit responsive to an output from the first delay circuit and to the first clock signal;
a plurality of analog synchronous mirror delay circuits that are responsive to the at least one logic circuit; and
an edge detector that is responsive to respective outputs of the plurality of analog synchronous mirror delay circuits
a voltage controlled delay circuit that is responsive to an output of the coarse locking circuit and to a voltage control signal;
a second delay circuit that is responsive to an output of the voltage controlled delay circuit; and
a fine locking circuit that is responsive to an output of the second delay circuit and the first clock signal that is configured to generate the voltage control signal.

3. The clock generation circuit of claim 2, wherein each of the plurality of analog synchronous mirror delay circuits comprises:

a first precharge circuit that is responsive to a first precharge signal;

a second precharge circuit that is responsive to a second precharge signal;

a first discharge circuit coupled to the output of the first precharge circuit that is responsive to a first reference input signal;

a second discharge circuit coupled to the output of the second precharge circuit that is responsive to a second reference input signal;

a first charge circuit coupled to the output of the first precharge circuit;

second charge circuit coupled to the output of the second precharge circuit; and a comparison circuit coupled to the outputs of the first precharge circuit and the second precharge circuit.

4. The clock generation circuit of claim 3, wherein the first and second precharge signals comprise the same signal.

5. The clock generation circuit of claim 2, wherein the fine locking circuit comprises:
   a phase detector;
   a phase comparator responsive to the output of the phase detector; and
   a low pass filter responsive to the output of the phase comparator.

6. The clock generation circuit of claim 2, further comprising a third delay circuit responsive to the output of the voltage controlled delay circuit.

7. The clock generation circuit of claim 6, further comprising a fourth delay circuit that is configured to generate the first clock signal from an external clock signal.

8. A clock generation circuit, comprising:
   a first delay circuit that is responsive to a first clock signal;
   a coarse locking circuit that includes at least one analog synchronous mirror delay circuit, the coarse locking circuit responsive to an output from the first delay circuit and to the first clock signal;
   a voltage controlled delay circuit that is responsive to an output of the coarse locking circuit and to a voltage control signal;
   a second delay circuit that is responsive to an output of the voltage controlled delay circuit;
   a fine locking circuit that is responsive to an output of the second delay circuit and the first clock signal that is configured to generate the voltage control signal; and
   a discharge control signal generation circuit that is configured to control a logic state of a discharge control signal that is output by the discharge control signal generation circuit based on the frequency of a clock cycle of an external clock signal, wherein the discharge control signal is coupled to the coarse locking circuit.

9. The clock generation circuit of claim 8, wherein the discharge control signal generation circuit comprises:
   a reference frequency generation circuit responsive to a rising edge of clock cycle of the external clock signal;
   a start clock acquisition circuit that is configured to acquire the clock cycle of the external clock signal; and
   an active range comparison circuit that is configured to generate the discharge control signal in response to the output of the reference frequency generation circuit and the start clock acquisition circuit.

10. A method of generating an internal clock signal that is synchronized with an external clock signal, the method comprising:
    providing first and second clock signals, at least one of which is derived from the external clock signal, to a coarse locking circuit that includes at least two analog synchronous mirror delay circuits;
    using the analog synchronous mirror delay circuits to generate a third clock signal, wherein a first of the analog synchronous mirror delay circuits is used to generate at least some of the rising edges of the third clock signal, and wherein a second of the analog synchronous mirror delay circuits is used to generate at least some of the falling edges of the third clock signal;
    delaying the third clock signal by a first transmission delay time that is determined based on a value of a control signal to lock the first clock signal to a fourth clock signal;
    providing the delayed third clock signal to a fine locking circuit;
    using the fine locking circuit to generate the control signal; and
    generating the internal clock signal from one of the first, second or third clock signals;
    wherein the locking of the first clock signal to the fourth clock signal locks the internal clock signal to the external clock signal.

11. The method of claim 10, wherein generating the internal clock signal comprises further delaying the delayed third clock signal to provide the internal clock signal.

12. The method of claim 10, wherein providing the first clock signal comprises buffering the external clock signal by a second transmission delay time to generate the first clock signal.

13. The method of claim 12, wherein providing the second clock signal comprises delaying the first clock signal by a first mirroring delay time to generate the second clock signal.

14. The method of claim 13, further comprising further delaying the delayed third clock signal by a second mirroring delay time to provide the fourth clock signal that is provided to the fine locking circuit.

15. The method of claim 10, wherein the fourth clock signal is generated by further delaying the delayed third clock signal.

16. A method of generating an internal clock signal that is synchronized with an external clock signal, the method comprising:
    generating a first clock signal by buffering the external clock signal by a second transmission delay time;
    generating a second clock signal by delaying the first clock signal by a first mirroring delay time;
    providing the first and second clock signals to a coarse locking circuit that includes a plurality of analog synchronous mirror delay circuits
    using the plurality of analog synchronous mirror delay circuits to generate a third clock signal;
    delaying the third clock signal by a first transmission delay time that is determined based on a value of a control signal to lock the first clock signal to a fourth clock signal;
    delaying the delayed third clock signal by a second mirroring delay time to provide the fourth clock signal;
    providing the fourth clock signal to a fine locking circuit;
    using the fine locking circuit to generate the control signal;
    generating the internal clock signal from one of the first, second or third clock signals;
    wherein the locking of the first clock signal to the fourth clock signal locks the internal clock signal to the external clock signal;
    wherein generating the internal clock signal from one of the first, second or third clock signals comprises delaying the delayed third clock signal by a third transmission delay time to provide the internal clock signal.

17. The method of claim 16, wherein the first mirroring delay time is equal to a sum of the first transmission delay time, a second transmission delay time and the third transmission delay time, and wherein the second mirroring delay time is equal to a sum of the second transmission delay time and the third transmission delay time.

18. The method of claim 16, wherein using the fine locking circuit to generate the control signal comprises generating the control signal based on a comparison of a phase of the fourth clock signal and a phase of the first clock signal.

19. A method of generating an internal clock signal that is synchronized with an external clock signal, the method comprising:
delaying a first clock signal by a first delay time to generate a second clock signal;
providing the first clock signal and the second clock signal to a coarse locking block that includes at least one analog synchronous mirror delay circuit to generate a third clock signal,
delaying the third clock signal by a second transmission delay time to generate a fourth clock signal;
delaying the fourth clock signal by a third transmission delay time to generate the internal clock signal;
delaying a copy of the fourth clock signal by a second delay time to generate a fifth clock signal, the second delay time being equal to a sum of a first transmission delay time and a third transmission delay time; and
generating a control signal based on a comparison of a phase of the fifth clock signal and a phase of the first clock signal; and
using the control signal to control the second delay time so as to lock the fifth clock signal to the first clock signal, wherein the locking of the fifth clock signal to the first clock signal locks the internal clock signal to the external clock signal.

20. The method of claim 19, further comprising generating the first clock signal from the external clock signal by offsetting the external clock signal by the first transmission delay time.

21. The method of claim 19, wherein the first delay time is equal to the sum of the first transmission delay time, the second transmission delay time and the third transmission delay time.

22. The method of claim 19, further comprising using the analog synchronous mirror delay circuit to provide an analog output clock signal that is used to generate an edge of the third clock signal.

23. The method of claim 22, wherein providing the analog output clock signal comprises:
providing an analog output clock signal having a first logic state;
precharging first and second comparison signals to a predetermined precharge level;
discharging the first comparison signal with a reference discharge capability during a first interval to a predetermined discharge voltage level;
discharging the second comparison signal with the reference discharge capability during a second interval that is different than the first interval to the predetermined discharge voltage level; and
changing the logic state of the analog output clock signal in response to the voltage of second comparison signal reaching the predetermined discharge voltage level.

24. The method of claim 23, further comprising controlling the precharge and discharge of the first and second comparison signals using signals generated by logical combinations of the first clock signal and the second clock signal.

25. The method of claim 23, further comprising setting the reference discharge capability based on the frequency variation of the external clock signal.

26. The method of claim 23, further comprising:
generating a discharge control signal that has a logic state that is based on a frequency of a clock cycle of the external clock signal; and
using the discharge control signal to control the reference discharge capability.

27. The method of claim 26, wherein generating a discharge control signal comprises:
generating a reference frequency signal having a predetermined active range in response to a rising edge of a cycle of the external clock signal;
generating a clock start signal based on acquisition of the clock cycle of the external clock signal; and
generating the discharge control signal based on the reference frequency signal and the clock start signal, wherein the discharge control signal has a logic state based on a ratio of a width of an active range of the clock start signal to a width of an active range of the reference frequency signal.

* * * * *